(12) United States Patent
Shimada et al.

(10) Patent No.: US 11,555,246 B2
(45) Date of Patent: Jan. 17, 2023

(54) SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Hironori Shimada, Toyama (JP); Daigi Kamimura, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/246,049

(22) Filed: Apr. 30, 2021

(65) Prior Publication Data
US 2021/0246554 A1   Aug. 12, 2021

Related U.S. Application Data

(63) Continuation of application No. 16/422,301, filed on May 24, 2019, now Pat. No. 11,015,248.

(30) Foreign Application Priority Data

May 25, 2018 (JP) .............................. JP2018-100711

(51) Int. Cl.
*C23C 16/455* (2006.01)
*C23C 16/52* (2006.01)
(Continued)

(52) U.S. Cl.
CPC .... *C23C 16/45578* (2013.01); *C23C 16/4584* (2013.01); *C23C 16/45504* (2013.01);
(Continued)

(58) Field of Classification Search
CPC .............. C23C 16/45578; C23C 16/52; C23C 16/45504; C23C 16/45546;
(Continued)

(56) References Cited

U.S. PATENT DOCUMENTS 10,689,758 B2 * 6/2020 Yoshida ............ C23C 16/45578
2007/0071896 A1   3/2007 Murphy et al.
(Continued)

FOREIGN PATENT DOCUMENTS

JP          2014-236129 A    12/2014
KR   10-2009-0084680 A       8/2009
(Continued)

OTHER PUBLICATIONS

Office Action in corresponding Japanese Patent Application No. 2018-100711, drafted Jul. 15, 2020, with English translation.
(Continued)

*Primary Examiner* — Ahmed N Sefer
(74) *Attorney, Agent, or Firm* — Edell, Shapiro & Finnan, LLC

(57) ABSTRACT

Described herein is a technique capable of suppressing a deviation in a thickness of a film formed on a substrate. According to one aspect of the technique of the present disclosure, a substrate processing apparatus includes a substrate retainer capable of supporting substrates; a cylindrical process chamber including a discharge part and supply holes; partition parts arranged in the circumferential direction to partition supply chambers communicating with the process chamber through the supply holes; nozzles provided with an ejection hole; and gas supply pipes. The supply chambers includes a first nozzle chamber and a second nozzle chamber, the process gas includes a source gas and an assist gas, the nozzles includes a first nozzle for the assist gas flows and a second nozzle disposed in the second nozzle chamber and through which the source gas flows, and the first nozzle is disposed adjacent to the second nozzle.

22 Claims, 15 Drawing Sheets

(51) Int. Cl.
*H01L 21/67* (2006.01)
*C23C 16/458* (2006.01)
*H01L 21/683* (2006.01)
*H01L 21/02* (2006.01)

(52) U.S. Cl.
CPC ........ *C23C 16/45546* (2013.01); *C23C 16/52* (2013.01); *H01L 21/02263* (2013.01); *H01L 21/02312* (2013.01); *H01L 21/67011* (2013.01); *H01L 21/67017* (2013.01); *H01L 21/67109* (2013.01); *H01L 21/67253* (2013.01); *H01L 21/683* (2013.01)

(58) Field of Classification Search
CPC ........... C23C 16/4584; H01L 21/67253; H01L 21/67109; H01L 21/67011
See application file for complete search history.

(56) References Cited

U.S. PATENT DOCUMENTS

| | | | |
|---|---|---|---|
| 2007/0084406 A1 | 4/2007 | Yudovsky et al. | |
| 2009/0197424 A1 | 8/2009 | Sakai et al. | |
| 2011/0306212 A1 | 12/2011 | Sato et al. | |
| 2012/0119337 A1 | 5/2012 | Sasaki et al. | |
| 2013/0260566 A1 | 10/2013 | Yamazaki | |
| 2013/0327273 A1 | 12/2013 | Okada | |
| 2014/0357058 A1 | 12/2014 | Takagi et al. | |
| 2016/0289833 A1 | 10/2016 | Okada et al. | |
| 2017/0232457 A1* | 8/2017 | Fujino | H01L 21/67109 118/724 |
| 2017/0271144 A1 | 9/2017 | Hashimoto et al. | |
| 2017/0294318 A1 | 10/2017 | Yoshida et al. | |
| 2018/0135176 A1 | 5/2018 | Morikawa et al. | |
| 2018/0151347 A1* | 5/2018 | Hanashima | C23C 16/45527 |
| 2020/0165722 A1* | 5/2020 | Saido | H01J 37/32458 |

FOREIGN PATENT DOCUMENTS

| | | |
|---|---|---|
| KR | 10-2016-0117256 A | 10/2016 |
| WO | 2015041376 A1 | 3/2015 |
| WO | 2015045137 A1 | 4/2015 |
| WO | 2016157401 A1 | 10/2016 |
| WO | 2018008088 A1 | 1/2018 |

OTHER PUBLICATIONS

Office Action in corresponding Korean Patent Application No. 10-2019-0059351, dated Jul. 29, 2020, with English translation.
Office Action in corresponding Korean Patent Application No. 10-2021-0050980, dated Jul. 1, 2021, with English translation.
Office Action in corresponding Taiwan Patent Application No. 109143912, dated Sep. 2, 2021, with English translation.

* cited by examiner

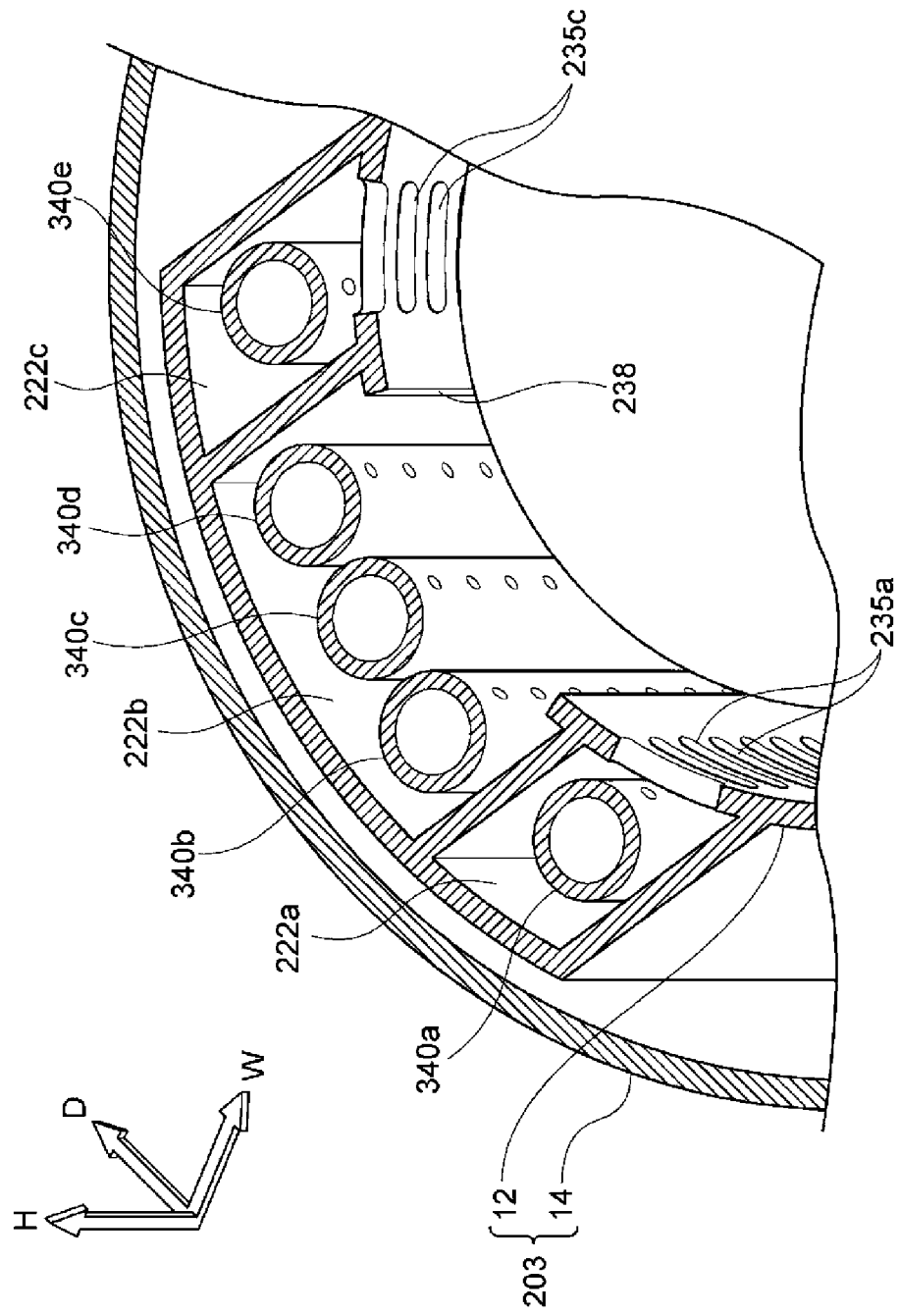

SUBSTRATE PROCESSING APPARATUS AND METHOD OF MANUFACTURING SEMICONDUCTOR DEVICE

CROSS REFERENCE TO RELATED APPLICATIONS

This application is a continuation of U.S. patent application Ser. No. 16/422,301 filed May 24, 2019, which claims foreign priority under 35 U.S.C. § 119(a)-(d) to Application No. JP 2018-100711 filed on May 25, 2018, the entire contents of which are hereby incorporated by reference.

TECHNICAL FIELD

The present disclosure relates to a substrate processing apparatus and a method of manufacturing a semiconductor device.

BACKGROUND

A substrate processing apparatus is used to form a film on a surface of a substrate (also referred to as a "wafer") disposed in a process chamber of the substrate processing apparatus.

When the film is formed on the substrate disposed in the process chamber, a source gas serving as a source material of the film and a carrier gas are ejected through the same ejection hole of the same gas nozzle toward the process chamber. Therefore, it may be difficult to control a flow rate of the source gas and a flow rate of the carrier gas individually. Thus, it may be difficult to form the film uniformly on the surface of the substrate (that is, a thickness of the film may be deviated on the surface of the substrate).

SUMMARY

Described herein is a technique capable of suppressing a deviation in a thickness of a film formed on a substrate.

According to one aspect of the technique of the present disclosure, there is provided a substrate processing apparatus including a substrate retainer capable of supporting a plurality of substrates while the plurality of the substrates is aligned in an axial direction; a tubular part having a cylindrical process chamber extending in the axial direction and capable of accommodating the substrate retainer, including: a discharge part capable of discharging a fluid in the process chamber to an outside thereof; and a plurality of supply holes configured to supply a process gas capable of processing the plurality of the substrates into the process chamber and disposed at positions different from the discharge part in a circumferential direction of the process chamber; a plurality of partition parts provided on an outer circumferential surface of the tubular part and arranged in the circumferential direction, the plurality of the partition parts being configured to partition a plurality of supply chambers communicating with the process chamber through the plurality of the supply holes; a plurality of nozzles extending in the axial direction, each of which is provided with, on a side surface thereof, at least one ejection hole configured to be able to eject at least one of the process gases flowing in the nozzle into the process chamber through the plurality of the supply holes, wherein one or more nozzles among the plurality of the nozzles are provided in a supply chamber among the plurality of the supply chambers; and a plurality of gas supply pipes through which the plurality of the nozzles communicate with a plurality of gas supply sources, respectively, wherein the plurality of the supply chambers includes a first nozzle chamber and a second nozzle chamber, the process gas includes a source gas serving as a source material of a film formed on the plurality of the substrates and an assist gas capable of controlling a flow of the source gas in the process chamber, and the plurality of the nozzles includes a first nozzle through which the assist gas flows and a second nozzle disposed in the second nozzle chamber and through which the source gas flows, and the first nozzle being disposed adjacent to the second nozzle.

BRIEF DESCRIPTION OF THE DRAWINGS

FIG. 15 is a perspective view schematically illustrating components such as a reaction tube provided in a substrate processing apparatus according to a fifth modified example of the embodiments.

DETAILED DESCRIPTION

Embodiments

Hereinafter, one or more embodiments (hereinafter, simply referred to as "embodiments") according to the technique will be described with reference to the drawings. An example of a substrate processing apparatus according to the embodiments will be described with reference to FIGS. 1 through 8. In the following drawings, an arrow H represents a height direction of the substrate processing apparatus (a vertical direction), an arrow W indicates a width direction of the substrate processing apparatus (a horizontal direction) and an arrow D indicates a depth direction of the substrate processing apparatus (another horizontal direction).

Overall Configuration of Substrate Processing Apparatus 10

Figure 2:
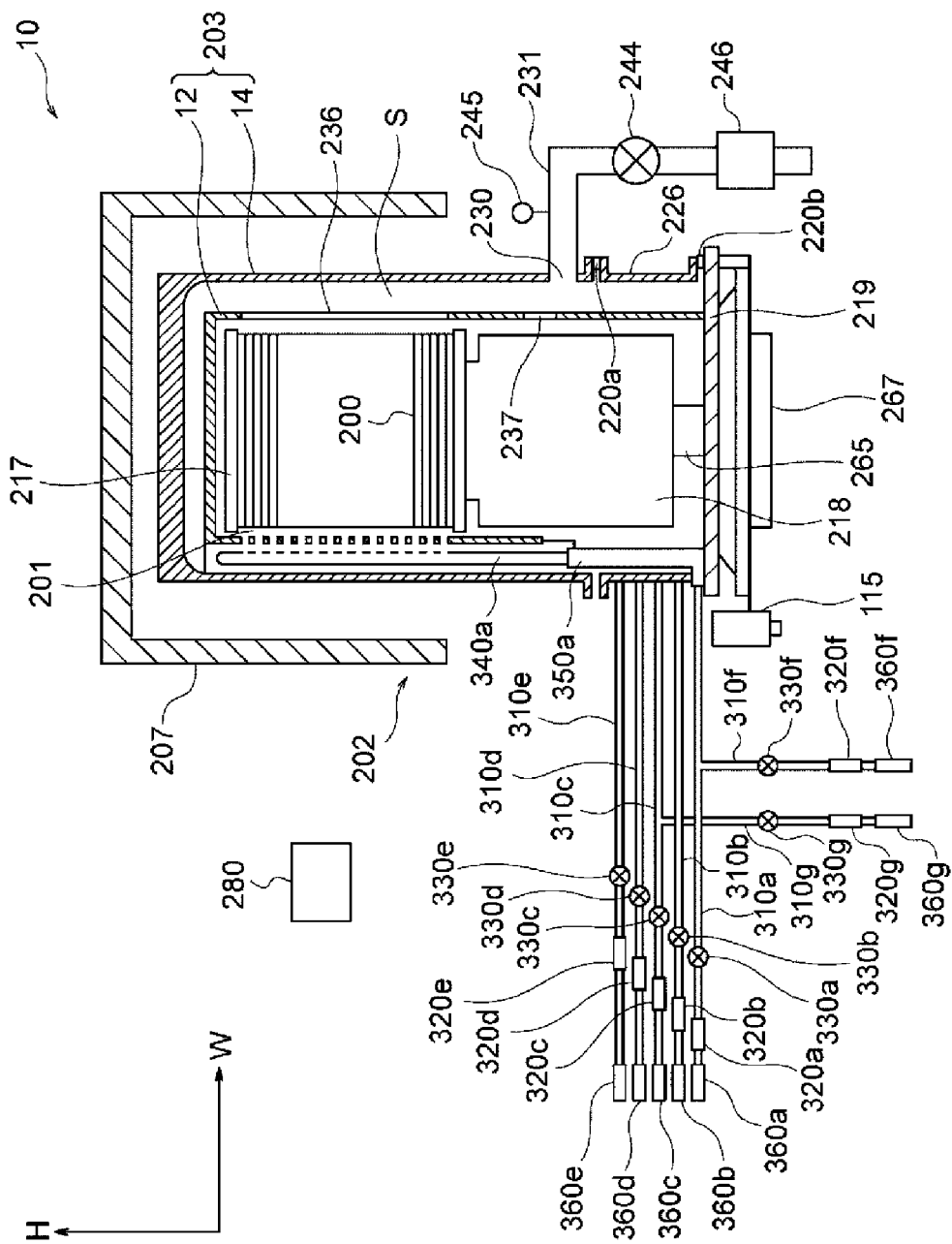
FIG. 2 schematically illustrates the substrate processing apparatus according to the embodiments described herein.

As shown in FIG. 2, the substrate processing apparatus 10 includes a controller 280 configured to control components of the substrate processing apparatus 10 and a process furnace. The process furnace 202 includes a heater 207 serving as a heating device (heating mechanism). The heater 207 is cylindrical, and is installed along the height direction of the substrate processing apparatus 10 (that is, vertically) while being supported by a heater base (not shown). The heater 207 also functions as an activation mechanism for activating process gases by heat. The controller 280 will be described later in detail.

A reaction tube 203 is provided inside the heater 207 so as to be concentric with the heater 207. A reaction tube 203 is installed vertically. For example, the reaction tube 203 is made of a heat resistant material such as quartz ($SiO_2$) and silicon carbide (SiC). The substrate processing apparatus 10 is a so-called "hot wall type" apparatus.

Figure 1:
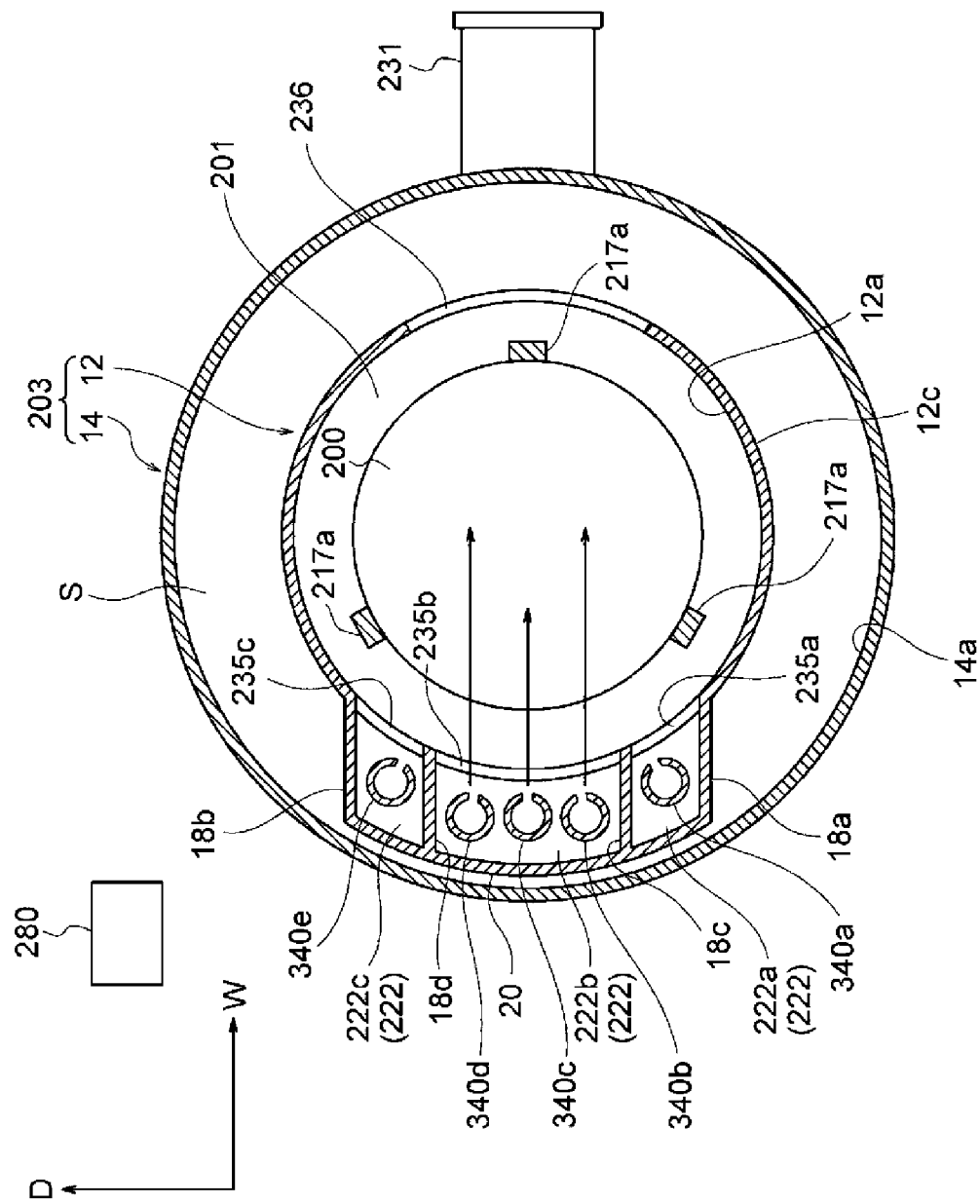
FIG. 1 schematically illustrates a horizontal cross-section of a substrate processing apparatus according to one or more embodiments described herein.

As shown in FIG. 1, the reaction tube 203 includes an inner tube 12 having a cylindrical shape and an outer tube 14 having a cylindrical shape and provided so as to surround the inner tube 12. The inner tube 12 is provided concentrically with the outer tube 14, and a gap S is provided between the inner tube 12 and the outer tube 14. The inner tube 12 is an example of a tubular part (tubular member).

As shown in FIG. 2, the inner tube 12 has a ceiling and is provided with an open lower end and a closed upper end. The upper end of the inner tube 12 is closed by a flat wall body. The outer tube 14 also has a ceiling and is provided with an open lower end and a closed upper end. The upper end of the outer tube 14 is closed by a flat wall body. As shown in FIG. 1, a plurality of nozzle chambers (for example, three nozzle chambers according to the embodiments) 222 is provided in the gap S defined between the inner tube 12 and the outer tube 14. The plurality of the nozzle chambers 222 will be described later in detail.

As shown in FIG. 2, a process chamber 201 where a wafer 200 serving as a substrate is processed is disposed in the interior of the inner chamber 12. The process chamber 201 is configured to accommodate a boat 217 serving as a substrate retainer capable of holding (supporting) a plurality of vertically arranged wafers including the wafer 200 in a horizontal orientation in a multistage manner. The inner tube 12 encloses the plurality of the wafers supported by the boat 217. The inner tube 12 will be described later in detail.

A lower end of the reaction tube 203 is supported by a cylindrical manifold 226. For example, the manifold 226 is made of a metal such as nickel alloy and stainless steel or is made of a heat resistant material such as quartz and SiC. A flange is provided at an upper end of the manifold 226, and the lower end of the outer tube 14 is provided on the flange and supported by the flange. A sealing part 220 such as an O-ring 220a is provided between the flange and the upper end of the manifold 226 to airtightly seal the inside of the reaction tube 203.

A seal cap 219 is airtightly attached to a lower end opening of the manifold 226 via a sealing part 220b such as an O-ring. The seal cap 219 is configured to airtightly seal a lower end opening of the reaction tube 203, that is, the lower end opening of the manifold 226. For example, the seal cap 219 is made of a metal such as a nickel alloy and stainless steel, and is disc-shaped. The seal cap 219 may be configured such that an outer side of the seal cap 219 is covered with a heat resistant material such as quartz ($SiO_2$) and silicon carbide (SiC).

A boat support 218 configured to support the boat 217 is provided on the seal cap 219. The boat support 218 is made of a heat resistant material such as quartz and SiC. The boat support 218 functions as a heat insulating part.

The boat 217 is provided vertically on the boat support 218. For example, the boat 217 is made of a heat resistant material such as quartz and SiC. The boat 217 includes a bottom plate (not shown) fixed to the boat support 218 and a top plate (not shown) provided above the bottom plate. As shown in FIG. 1, a plurality of support columns 217a is provided between the bottom plate and the top plate. The plurality of the support columns 217a is installed to connect the bottom plate and the top plate.

The boat 217 accommodates (supports) the plurality of the wafers including the wafer 200 to be processed in the process chamber 201 disposed in the inner tube 12. The plurality of the wafers is horizontally oriented with predetermined intervals therebetween. As shown in FIG. 1, the plurality of the wafers is supported by the plurality of the support columns 217a of the boat 271 with their centers aligned with each other. The stacking direction of the plurality of the wafers is equal to an axial direction of the reaction tube 203. That is, the centers of the plurality of the wafers are aligned with a central axis of the boat 217, and the central axis of the boat 217 coincides with a central axis of the reaction tube 203.

A boat rotating mechanism 267 to rotate the boat 217 is provided under the seal cap 219. A rotating shaft 265 of the boat rotating mechanism 267 is connected to the boat 217 through the seal cap 219. As the boat rotating mechanism 267 rotates the boat 217 via the boat support 218, the plurality of the wafers including the wafer 200 supported by the boat 217 is rotated.

The seal cap 219 may be moved upward or downward in the vertical direction by a boat elevator 115 provided outside the reaction tube 203. The boat elevator 115 serves as an elevating mechanism. As the seal cap 219 is moved upward or downward by the boat elevator 115, the boat 217 is transferred (loaded) into the process chamber 201 or transferred (unloaded) out of the process chamber 201.

Figure 6:
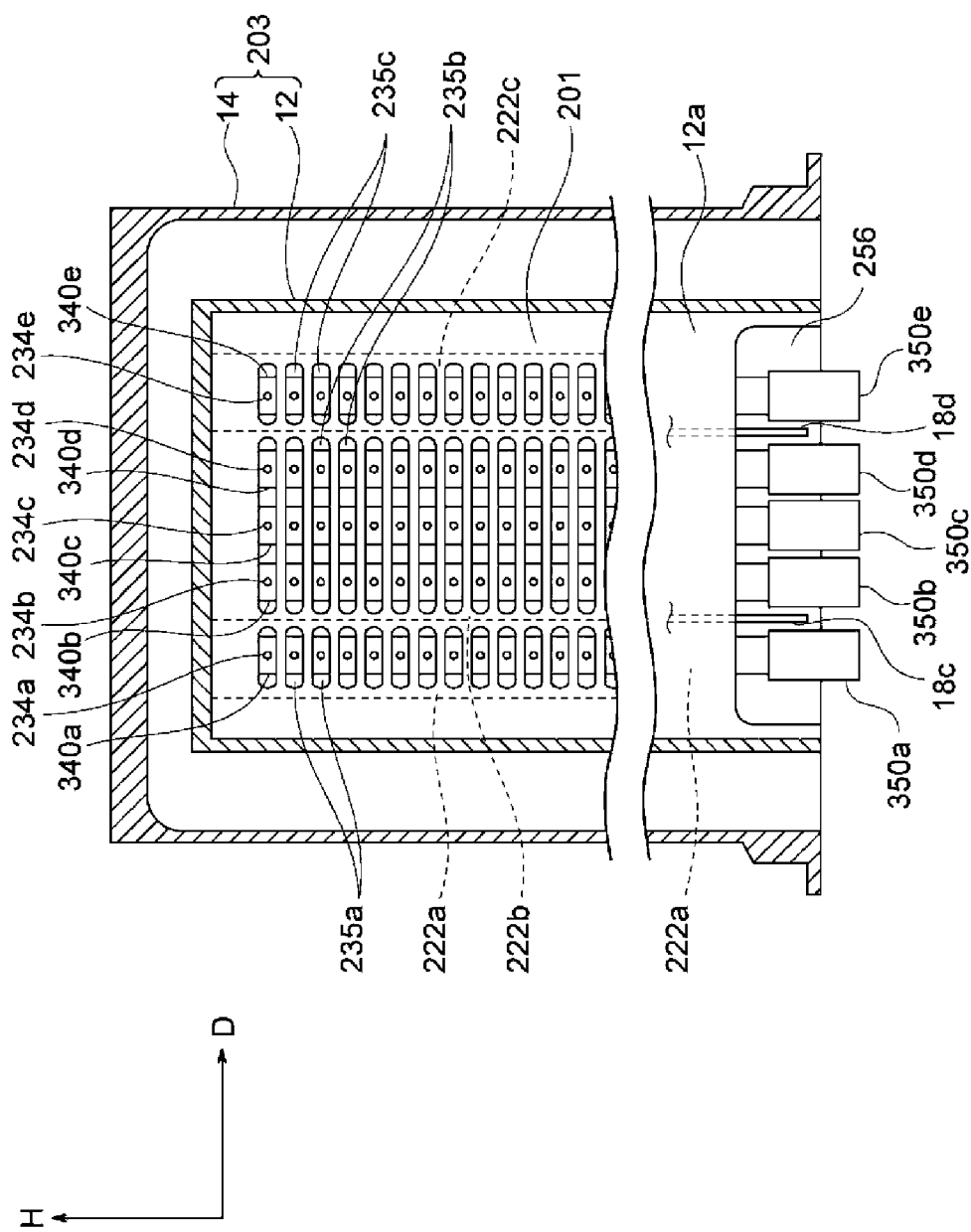
FIG. 6 schematically illustrates another vertical cross-section of the substrate processing apparatus according to the embodiments.

A plurality of nozzle supports 350a through 350e shown in FIG. 6, which is configured to support a plurality of gas nozzles 340a through 340e, passes through the manifold 226. The plurality of the gas nozzles 340a through 340e is configured to supply gases such as the process gases into the process chamber 201. In FIG. 2, only the gas nozzle 340a among the plurality of the gas nozzles 340a through 340e and only the nozzle support 350a among the plurality of the nozzle supports 350a through 350e are shown. According to the embodiments, for example, as shown in FIG. 6, five nozzle supports 350a through 350e are installed. According to the embodiments, five nozzle supports 350a through 350e are exemplified. However, the number of the plurality of the nozzle supports is not limited thereto. The same also applies to the number of the plurality of the gas nozzles and the number of plurality of gas supply pipes described later. For example, the plurality of the nozzle supports 350a through 350e is made of a material such as nickel alloy and stainless steel.

The plurality of the gas supply pipes 310a through 310e configured to supply the gases such as the process gases into the process chamber 201 is connected to first ends of the plurality of the nozzle supports 350a through 350e, respectively. The plurality of the gas nozzles 340a through 340e is connected to second ends of the plurality of the nozzle supports 350a through 350e shown in FIG. 6, respectively. As described above, in FIG. 2, only the gas nozzle 340a among the plurality of the gas nozzles 340a through 340e and only the nozzle support 350a among the plurality of the nozzle supports 350a through 350e are shown. For example, the plurality of the gas nozzles 340a through 340e is fabricated by forming pipes of a heat resistant material such as quartz and SiC into a desired shape. The plurality of the gas nozzles 340a through 340e and the plurality of the gas supply pipes 310a through 310e will be described later in detail.

An exhaust port 230 is provided at the outer tube 14 of the reaction tube 203. The exhaust port 230 is provided below a second exhaust port 237 described later. An exhaust pipe 231 is connected to the exhaust port 230.

A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (pressure detection mechanism) to detect an inner pressure of the process chamber 201, and the APC valve 244 serves as an pressure controller (pressure adjusting mechanism). The exhaust pipe 231 provided on a downstream side of the vacuum pump 246 is connected to a component such as a waste gas processing apparatus (not shown). Thus, by controlling an output of the vacuum pump 246 and an opening degree of the APC valve 244, it is possible to vacuum-exhaust the inside of the process chamber 201 such that the inner pressure of the process chamber 201 reaches a predetermined pressure (vacuum degree).

A temperature sensor (not shown) serving as a temperature detector is provided in the reaction tube 203. The power supplied to the heater 207 is adjusted based on temperature information detected by the temperature sensor, such that an inner temperature of the process chamber 201 has a desired temperature distribution.

According to the configuration of the process furnace 202 described above, the boat 217 with the plurality of the wafers including the wafer 200 to be batch-processed is transferred (loaded) into the process chamber 201 by the boat support 218 while the plurality of the wafers is accommodated in the boat 217 in multiple stages. Then, the wafer 200 transferred into the process chamber 201 is heated by the heater 207 to a predetermined temperature. An apparatus having the process furnace 202 described above is also referred to as a "vertical batch type apparatus".

Configuration of Main Components

Hereinafter, the inner tube 12, the plurality of the nozzle chambers 222, the plurality of the gas supply pipes 310a through 310e, the plurality of the gas nozzles 340a through 340e and the controller 280 will be described in detail.

Inner Tube 12

Figure 3:
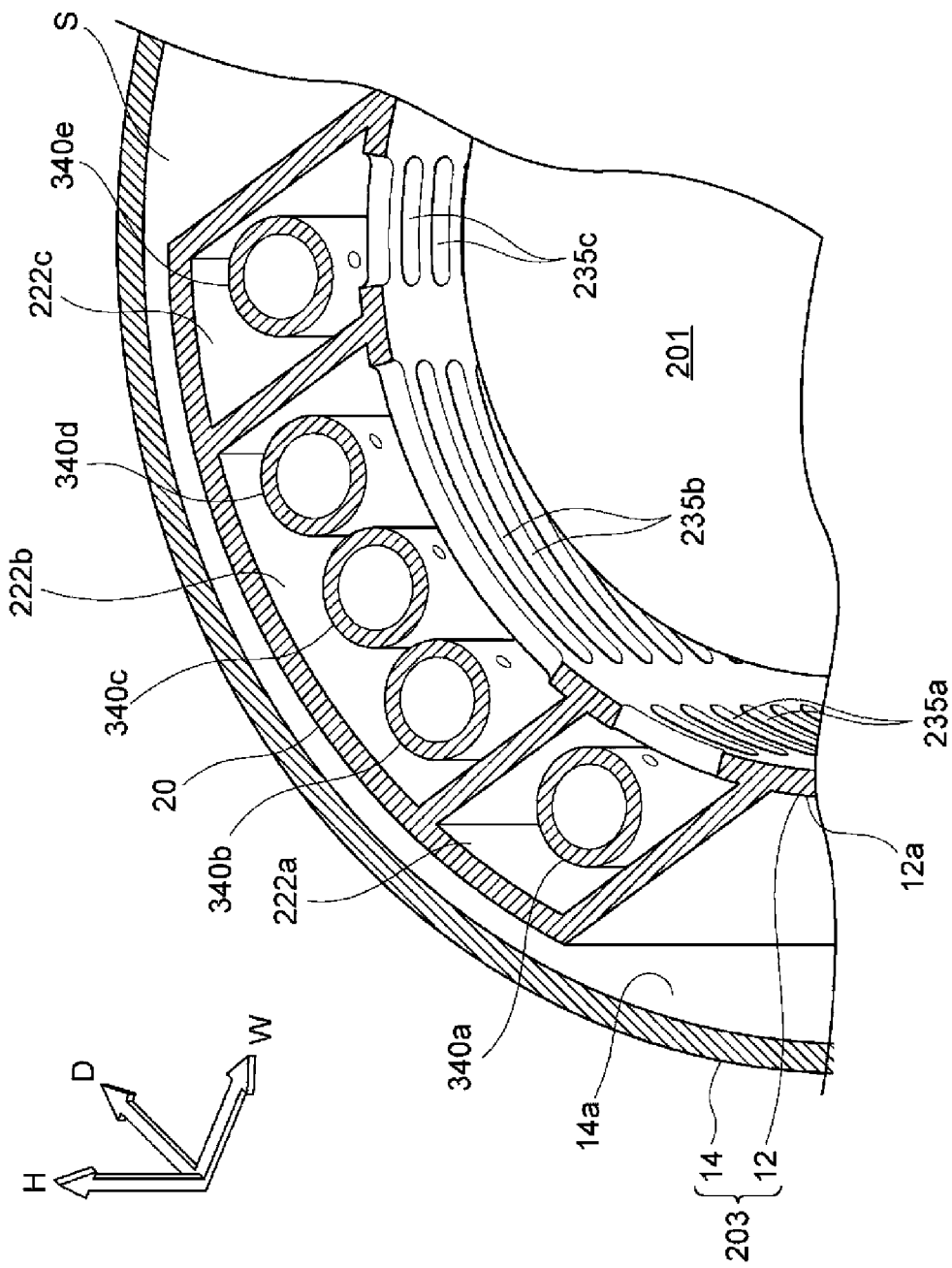
FIG. 3 is a perspective view schematically illustrating a part of a reaction tube of the substrate processing apparatus according to the embodiments.
Figure 4:
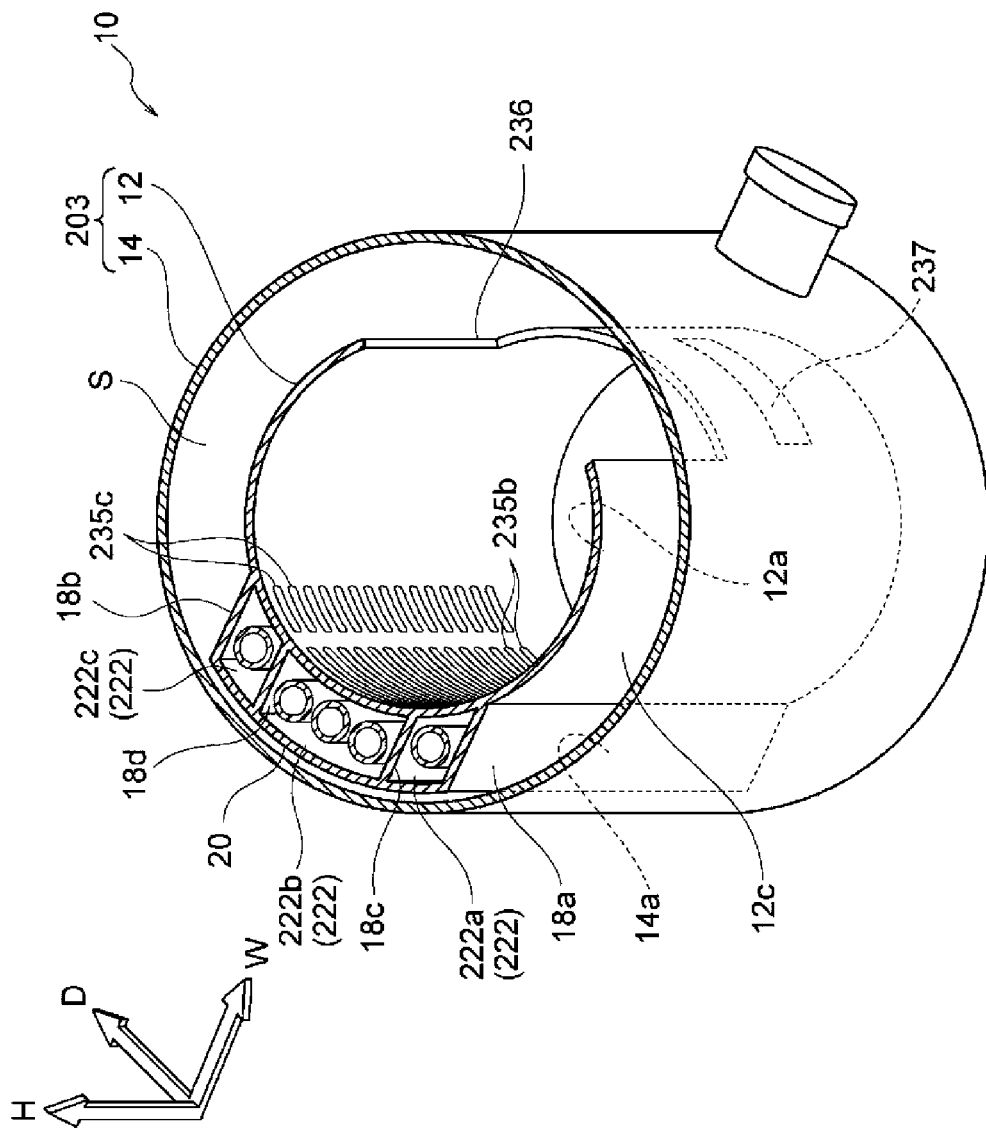
FIG. 4 is a perspective view schematically illustrating the entire reaction tube of the substrate processing apparatus according to the embodiments.

As shown in FIGS. 3 and 4, a plurality of supply slits 235a, a plurality of supply slits 235b and a plurality of supply slits 235c as an example of a plurality of supply holes are provided on a circumferential wall of the inner tube 12. A first exhaust port 236 as an example of a discharge part is provided on the circumferential wall of the inner tube 12 so as to face the plurality of the supply slits 235a, the plurality of the supply slits 235b and the plurality of the supply slits 235c. In addition, the second exhaust port 237 as an example of a discharge part having a smaller opening area than that of the first exhaust port 236 is provided on the circumferential wall of the inner tube 12 lower than the first exhaust port 236. As described above, the plurality of the supply slits 235a, the plurality of the supply slits 235a, the plurality of the supply slits 235b and the plurality of the supply slits 235c, the first exhaust port 236 and the second exhaust port 237 are provided at different locations in the circumferential direction of the inner tube 12.

As shown in FIG. 2, the first exhaust port 236 formed at the inner tube 12 is provided at a region of the process chamber 201 where the plurality of the wafers including the wafer 200 is accommodated from a lower end to an upper end thereof. Hereinafter, the region is also referred to as a "wafer region". As described above, the second exhaust port 237 is provided lower than the first exhaust port 236 of the inner tube 12. The process chamber 201 and the gap S communicate with each other through the first exhaust port 236, and an atmosphere of a lower portion of the process chamber 201 is exhausted through the second exhaust port 237.

That is, the first exhaust port 236 serves as a gas exhaust port configured to exhaust an inner atmosphere of the process chamber 201 to the gap S, and the gases exhausted through the first exhaust port 236 are exhausted to the outside of the reaction tube 203 through exhaust pipe 231 via the gap S and the exhaust port 230. Similarly, the gases exhausted through the second exhaust port 237 are exhausted to the outside of the reaction tube 203 through exhaust pipe 231 via a lower side of the gap S and the exhaust port 230.

According to the configuration of the inner tube 12 described above, the gases after passing through the wafer 200 is exhausted through the outside of the inner tube 12. Therefore, it is possible to minimize the pressure loss by decreasing the difference between a pressure of the exhaust part such as the vacuum pump 246 and a pressure of the wafer region. In addition, by minimizing the pressure loss, it is possible to decrease the pressure of the wafer region and to mitigate the loading effect by increasing the flow rates of the gases in the wafer region.

As shown in FIG. 6, the plurality of the supply slits 235a provided on the circumferential wall of the inner tube 12 has a shape of a horizontally elongated slit while being arranged in multiple stages in the vertical direction. As shown in FIG. 3, a first nozzle chamber 222a and the process chamber 201 communicate with each other through the plurality of the supply slits 235a.

The plurality of the supply slits 235b has a shape of a horizontally elongated slit while being arranged in multiple stages in the vertical direction. The plurality of the supply slits 235b is provided in parallel with the plurality of the supply slits 235a, respectively. As shown in FIG. 3, a second nozzle chamber 222b and the process chamber 201 communicate with each other through the plurality of the supply slits 235b.

The plurality of the supply slits 235c has a shape of a horizontally elongated slit while being arranged in multiple stages in the vertical direction. The plurality of the supply slits 235c is provided opposite to the plurality of the supply slits 235a with the plurality of the supply slits 235b interposed therebetween, respectively. As shown in FIG. 3, a third nozzle chamber 222c and the process chamber 201 communicate with each other through the plurality of the supply slits 235c.

Preferably, the gas supply efficiency is improved when the lengths (in the circumferential direction) of the plurality of the supply slits 235a, the plurality of the supply slits 235b and the plurality of the supply slits 235c of the inner tube 12 are the same as the lengths (in the circumferential direction) of the plurality of the nozzle chambers 222a through 222c, respectively.

Edge portions (such as four corners) of each of the plurality of the supply slits 235a, the plurality of the supply slits 235b and the plurality of the supply slits 235c are formed as smooth curves. By curving the edge portions by a process such as a rounding process (R process), it is possible to suppress the stagnation of the gases at the edge portions and to suppress the formation of a film on the edge portions. It is also possible to prevent the film from being peeled off when the film is formed on the edge portions.

An opening portion 256 is provided at a lower end of an inner circumferential surface 12a of the inner tube 12 where the plurality of the supply slits 235a, the plurality of the supply slits 235b and the plurality of the supply slits 235c are provided. The opening portion 256 is used to install the plurality of the gas nozzles 340a through 340e in their corresponding nozzle chambers 222a through 222c of the plurality of the nozzle chambers 222.

Figure 5:
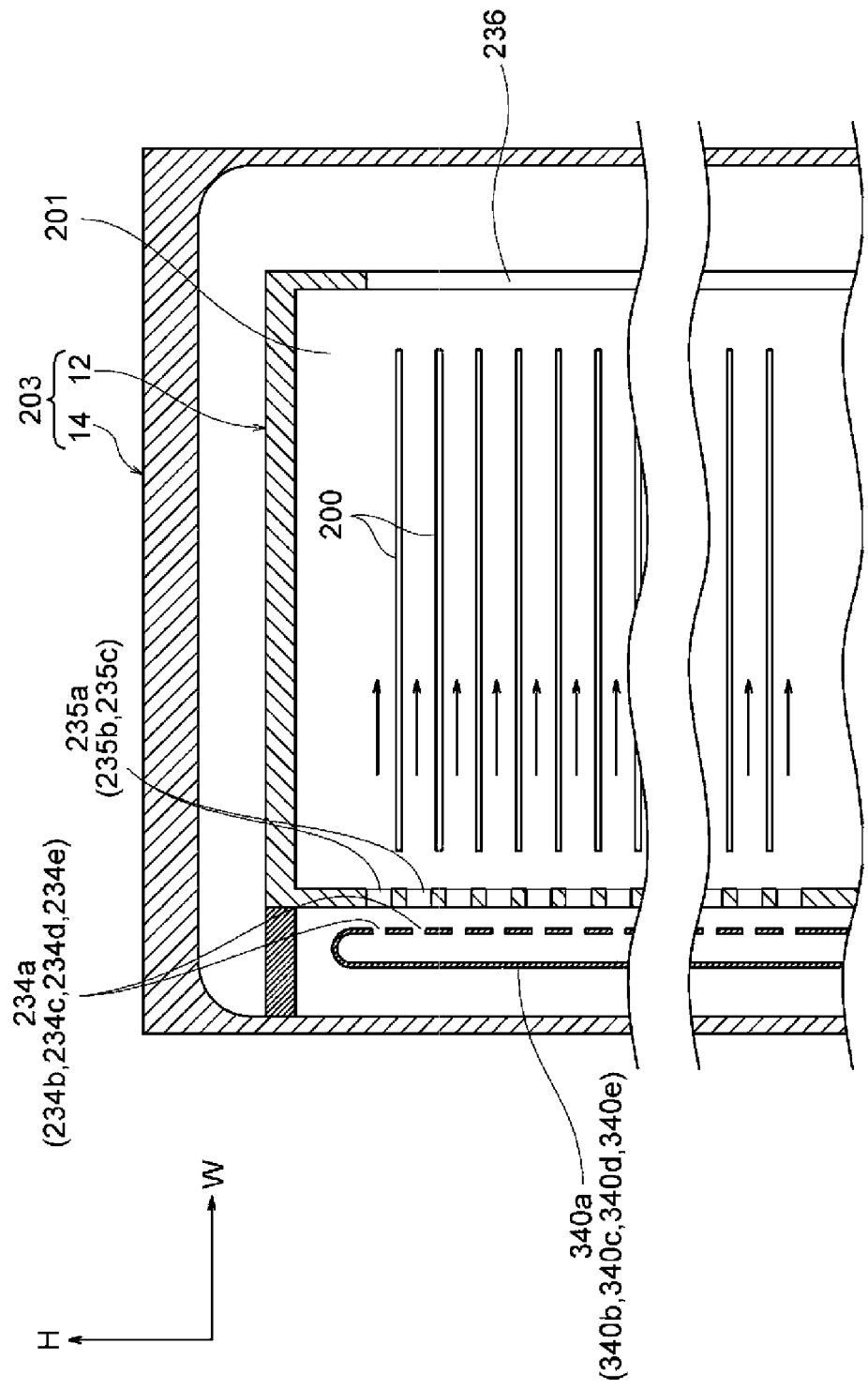
FIG. 5 schematically illustrates a vertical cross-section of the substrate processing apparatus according to the embodiments.

As shown in FIG. 5, the plurality of the supply slits 235a, the plurality of the supply slits 235b and the plurality of the supply slits 235c are arranged in the vertical direction so as to face spaces between adjacent wafers among the plurality of the wafers supported in multiple stages by the boat 217 shown in FIG. 2 accommodated in the process chamber 201.

Preferably, the plurality of the supply slits 235a, the plurality of the supply slits 235b and the plurality of the supply slits 235c are disposed from a location facing a space between a lowermost wafer and the bottom plate of the boat 217 to a location facing a space between an uppermost wafer and the top plate of the boat 217 so as to face the space between the lowermost wafer and the bottom plate, the space between the uppermost wafer and the top plate and all the other spaces between the adjacent wafers among the plurality of the wafers.

As described above, as shown in FIG. 2, the first exhaust port 236 is provided at the wafer region of the inner tube 12, and the process chamber 201 and the gap S communicate with each other through the first exhaust port 236. The second exhaust port 237 is provided from a location higher than an upper end of the exhaust port 230 to a location higher than a lower end of the exhaust port 230.

Nozzle Chambers 222

As shown in FIGS. 1 and 4, the plurality of the nozzle chambers 222 is provided in the gap S between an outer circumferential surface 12c of the inner tube 12 and an inner circumferential surface 14a of the outer tube 14. The plurality of the nozzle chambers 222 is constituted by the first nozzle chamber 222a extending in the vertical direction, the second nozzle chamber 222b extending in the vertical direction and the third nozzle chamber 222c extending in the vertical direction. The first nozzle chamber 222a, the second nozzle chamber 222b and the third nozzle chamber 222c are disposed in this order along the circumferential direction of the process chamber 201.

Regarding circumferential lengths along the circumferential direction of the process chamber 201, the circumferential length of the second nozzle chamber 222b is longer than the circumferential length of the first nozzle chamber 222a and the circumferential length of the third nozzle chamber 222c. The first nozzle chamber 222a, the second nozzle chamber 222b and the third nozzle chamber 222c are examples of a supply chamber (also referred to as a "supply buffer").

Specifically, the plurality of the nozzle chambers 222 are provided in a space defined by a first partition 18a, a second partition 18b, an arc-shaped outer wall 20 and the inner tube 12. The first partition 18a and the second partition 18b extend in parallel from the outer circumferential surface 12c of the inner tube 12 toward the outer tube 14. The arc-shaped outer wall 20 is configured to connect a front end of the first partition 18a and a front end of the second partition 18b.

In addition, a third partition 18c and a fourth partition 18d are provided in the plurality of the nozzle chambers 222. The third partition 18c and the fourth partition 18d extend from the outer circumferential surface 12c of the inner tube 12 toward the outer wall 20. The third partition 18c and the fourth partition 18d are located closer to the first partition 18a and the second partition 18b, respectively. The outer wall 20 is separated from the outer tube 14. A front end of the third partition 18c and a front end of the fourth partition 18d reach the outer wall 20. The first through fourth partitions 18a through 18d and the outer wall 20 are examples of a partition part (partition member).

The first through fourth partitions 18a through 18d and the outer wall 20 extend vertically from a ceiling portion of the plurality of the nozzle chambers 222 to the lower end of the reaction tube 203. Specifically, as shown in FIG. 6, a lower end of the third partition 18c and a lower end of the fourth partition 18d extend to locations lower than an upper edge of the opening portion 256.

As shown in FIG. 1, the first nozzle chamber 222a is defined by being surrounded by the inner tube 12, the first partition 18a, the third partition 18c and the outer wall 20, and the second nozzle chamber 222b is defined by being surrounded by the inner tube 12, the third partition 18c, the fourth partition 18d and the outer wall 20. The third nozzle chamber 222c is defined by being surrounded by the inner tube 12, the fourth partition 18d, the second partition 18b and the outer wall 20. As a result, the first nozzle chamber 222a, the second nozzle chamber 222b and the third nozzle chamber 222c extend in the vertical direction, each of which has a ceiling by being provided with an open lower end and a closed upper end. The upper ends of the first nozzle chamber 222a, the second nozzle chamber 222b and the third nozzle chamber 222c are closed by the flat wall body constituting the ceiling of the inner tube 12.

As described above, as shown in FIG. 6, the plurality of the supply slits 235a for communicating the first nozzle chamber 222a with the process chamber 201 is arranged on the circumferential wall of the inner tube 12 in multiple stages in the vertical direction. The plurality of the supply slits 235b for communicating the second nozzle chamber 222b with the process chamber 201 is arranged on the circumferential wall of the inner tube 12 in multiple stages in the vertical direction, and the plurality of the supply slits 235c for communicating the third nozzle chamber 222c with the process chamber 201 is arranged on the circumferential wall of the inner tube 12 in multiple stages in the vertical direction.

Gas Nozzles 340a Through 340e

The plurality of the gas nozzles 340a through 340c extends in the vertical direction, and as shown in FIG. 1, is provided in the respective nozzle chambers 222a through 222c. Specifically, as shown in FIG. 2, the gas nozzle 340a communicating with the gas supply pipe 310a is disposed in the first nozzle chamber 222a. As shown in FIG. 2, the gas nozzle 340b communicating with the gas supply pipe 310b, the gas nozzle 340c communicating with the gas supply pipe 310c and the gas nozzle 340d communicating with the gas supply pipe 310d are disposed in the second nozzle chamber 222b. As shown in FIG. 2, the gas nozzle 340e communicating with the gas supply pipe 310e is disposed in the third nozzle chamber 222c.

When viewed from above, the gas nozzle 340c serving as a second nozzle is interposed between the gas nozzles 340b and 340d collectively serving as a first nozzle in the circumferential direction of the process chamber 201. The gas nozzle 340a serving as a third nozzle and the gas nozzles 340b, 340c and 340d are partitioned by the third partition 18c, and the gas nozzles 340b, 340c and 340d and the gas nozzle 340e are partitioned by the fourth partition 18d. As a result, it is possible to prevent the gases from being mixed with one another among the plurality of the nozzle chambers 222 (that is, among the first nozzle chamber 222a, the second nozzle chamber 222b and the third nozzle chamber 222c).

For example, each of the plurality of the gas nozzles 340a through 340e is configured as an I-shaped long nozzle. As shown in FIGS. 5 and 6, a plurality of ejection holes 234a, a plurality of ejection holes 234b, a plurality of ejection holes 234c, a plurality of ejection holes 234d and a plurality of ejection holes 234e configured to eject the gases are provided on the circumferential surfaces of the plurality of the gas nozzles 340a through 340e, respectively, so as to face the plurality of the supply slits 235a, the plurality of the supply slits 235b and the plurality of the supply slits 235c. Specifically, it is preferable that the plurality of the ejection holes 234a through the plurality of the ejection holes 234e face central portions of the plurality of the supply slits 235a, the plurality of the supply slits 235b and the plurality of the supply slits 235c with one-to-one correspondence with one of the plurality of the supply slit 235a, the plurality of the supply slits 235b and the plurality of the supply slits 235c. For example, when the number of the supply slits 235a, the number of the supply slits 235b is 25 and the number of the supply slits 235c are all 25, it is preferable that the number of the ejection holes 234a through the number of the ejection holes 234e are all 25. It is preferable that the number of the supply slits 235a through the number of the ejection holes 234e are all greater than the number of the wafers supported by the boat 217 by one. With the configurations of the plurality of the supply slit 235a through the plurality of the supply slits 235c and the plurality of the ejection holes 234a through the plurality of the ejection holes 234e described above, it is possible to form a flow of the process gases on each of the plurality of the wafers including the wafer 200 in a direction parallel to the plurality of the wafers as indicated by arrows shown in FIG. 5.

According to the embodiments, each of the plurality of the ejection holes 234a through the plurality of the ejection holes 234e is configured to have a shape of a pinhole. The gases ejected through the plurality of the ejection holes 234a of the gas nozzle 340a are directed to the center of the process chamber 201 when viewed from above, and are directed to the space between the lowermost wafer and the bottom plate (which is located lower than a lower surface of the lowermost wafer), the space between the uppermost wafer and the top plate (which is located higher than an upper surface of the uppermost wafer) and the spaces between the adjacent wafers among the plurality of the wafers when viewed from aside as shown in FIG. 5.

As described above, a range in which the plurality of the ejection holes 234a through the plurality of the ejection holes 234e are arranged in the vertical direction covers a range in which the plurality of the wafers including wafer 200 is arranged in the vertical direction. In addition, ejection directions in which the gases are ejected through the plurality of the ejection holes 234a through the plurality of the ejection holes 234e are all identical.

According to the configurations described above, the gases ejected via the plurality of the ejection holes 234a through the plurality of the ejection holes 234e of the plurality of the gas nozzles 340a through 340e are supplied into the process chamber 201 through the plurality of the supply slits 235a, the plurality of the supply slits 235b and the plurality of the supply slits 235c provided at the inner tube 12. The inner tube 12 constitutes front walls of the nozzle chambers 222a through 222c. Then, the gases supplied into the process chamber 201 flows along upper and lower surfaces of the plurality of the wafers including the wafer 200, as indicated by arrows shown in FIG. 5.

As shown in FIG. 6, the gas nozzle 340a is supported by the nozzle support 350a, the gas nozzle 340b is supported by the nozzle support 350b, the gas nozzle 340c is supported by the nozzle support 350c, the gas nozzle 340d is supported by the nozzle support 350d and the gas nozzle 340e is supported by the nozzle support 350e. In addition, the plurality of the nozzle supports 350a through 350e is disposed in the opening portion 256, respectively.

When the plurality of the gas nozzles 340a through 340e is installed in the nozzle chambers 222a through 222c as described above, the plurality of the gas nozzles 340a through 340e is inserted into the corresponding nozzle chambers 222a through 222c through the opening portion 256, and lower ends of the plurality of the gas nozzles 340a through 340e are lifted above upper ends of the plurality of the nozzle supports 350a through 350e. Then, the lower ends of the plurality of the gas nozzles 340a through 340e are inserted into the plurality of the nozzle supports 350a through 350e so that the lower ends of the plurality of the gas nozzles 340a through 340e are lower than the upper ends of the plurality of the nozzle supports 350a through 350e. Thereby, as shown in FIG. 1, the plurality of the gas nozzles 340a through 340e is accommodated in the nozzle chambers 222a through 222c.

Gas Supply Pipes 310a Through 310e

As shown in FIG. 2, the gas supply pipe 310a communicates with the gas nozzle 340a through the nozzle support 350a. As shown in FIG. 6, the gas supply pipe 310b communicates with the gas nozzle 340b through the nozzle support 350b, the gas supply pipe 310c communicates with the gas nozzle 340c through the nozzle support 350c, the gas supply pipe 310d, communicates with the gas nozzle 340d, through the nozzle support 350d and the gas supply pipe 310e communicates with the gas nozzle 340e through the nozzle support 350e.

A source gas supply source 360a for supplying a first source gas (also referred to as a "reactive gas") serving as one of the process gases, a mass flow controller (MFC) 320a serving as a flow rate controller (flow rate control mechanism) and a valve 330a serving as an opening/closing valve are sequentially provided at the gas supply pipe 310a from an upstream side toward a downstream side in a gas flow direction.

An inert gas supply source 360b for supplying the inert gas serving as one of the process gases, a mass flow controller (MFC) 320b and a valve 330b are sequentially provided at the gas supply pipe 310b from the upstream side toward the downstream side in the gas flow direction. A source gas supply source 360c for supplying a second source gas serving as one of the process gases, a mass flow controller (MFC) 320c and a valve 330c are sequentially provided at the gas supply pipe 310c from the upstream side toward the downstream side in the gas flow direction. An inert gas supply source 360*d* for supplying the inert gas serving as one of the process gases, a mass flow controller (MFC) 320*d* and a valve 330*d* are sequentially provided at the gas supply pipe 310*d* from the upstream side toward the downstream side in the gas flow direction.

An inert gas supply source 360*e* for supplying the inert gas serving as one of the process gases, a mass flow controller (MFC) 320*e* and a valve 330*e* are sequentially provided at the gas supply pipe 310*e* from the upstream side toward the downstream side in the gas flow direction.

A gas supply pipe 310*f* configured to supply the inert gas is connected to the gas supply pipe 310*a* at a downstream side of the valve 330*a*. An inert gas supply source 360*f* for supplying the inert gas serving as one of the process gases, a mass flow controller (MFC) 320*f* and a valve 330*f* are sequentially provided at the gas supply pipe 310*f* from the upstream side toward the downstream side in the gas flow direction.

A gas supply pipe 310*g* configured to supply the inert gas is connected to the gas supply pipe 310*c* at a downstream side of the valve 330*c*. An inert gas supply source 360*g* for supplying the inert gas serving as one of the process gases, a mass flow controller (MFC) 320*g* and a valve 330*g* are sequentially provided at the gas supply pipe 310*g* from the upstream side toward the downstream side in the gas flow direction. In addition, the inert gas supply sources 360*b*, 360*d*, 360*e*, 360*f* and 360*g* for supplying the inert gas may be connected to a common supply source.

As the first source gas supplied through the gas supply pipe 310*a*, ammonia ($NH_3$) gas may be used. As the second source gas supplied through the gas supply pipe 310*c*, a silicon (Si) source gas may be used. As the inert gas supplied through each of the gas supply pipes 310*b*, 310*d*, 310*e*, 310*f* and 310*g*, nitrogen ($N_2$) gas may be used.

Controller 280

Figure 7:
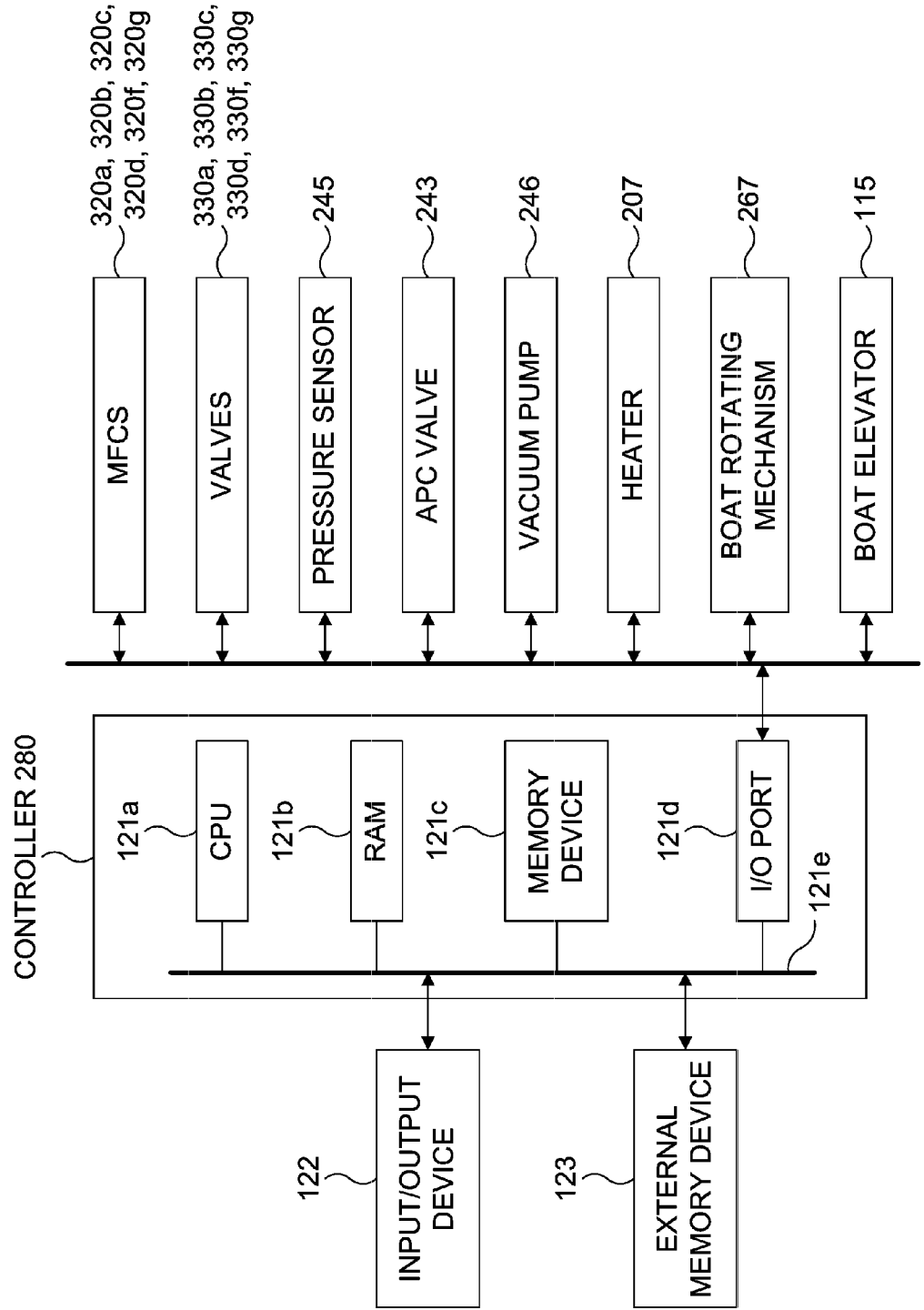
FIG. 7 is a block diagram schematically illustrating a configuration of a controller and related components of the substrate processing apparatus according to the embodiments.

FIG. 7 is a block diagram schematically illustrating a configuration of the controller 280 of the substrate processing apparatus 10 according to the embodiments. The controller 280 serving as a control device (control mechanism) is constituted by a computer including a CPU (Central Processing Unit) 121*a*, a RAM (Random Access Memory) 121*b*, a memory device 121*c* and an I/O port 121*d*.

The RAM 121*b*, the memory device 121*c* and the I/O port 121*d* may exchange data with the CPU 121*a* through an internal bus 121*e*. For example, an input/output device 122 such as a touch panel is connected to the controller 280.

For example, the memory device 121*c* is configured by components such as a flash memory and HDD (Hard Disk Drive). A control program for controlling the operation of the substrate processing apparatus 10 or a process recipe containing information on the sequences and conditions of a substrate processing described later is readably stored in the memory device 121*c*.

The process recipe is obtained by combining steps of the substrate processing described later such that the controller 280 can execute the steps to acquire a predetermine result, and functions as a program. Hereinafter, the process recipe and the control program are collectively referred to as a "program".

In the present specification, the term "program" may indicate only the process recipe, indicate only the control program, or indicate both of them. The RAM 121*b* functions as a memory area (work area) where a program or data read by the CPU 121*a* is temporarily stored.

The I/O port 121*d* is connected to the above-described components such as the MFCs 320*a* through 320*g*, the valves 330*a* through 330*g*, the pressure sensor 245, the APC valve 244, the vacuum pump 246, the heater 207, the temperature sensor (not shown), the boat rotating mechanism 267 and the boat elevator 115.

The CPU 121*a* is configured to read the control program from the memory device 121*c* and execute the control program. Furthermore, the CPU 121*a* is configured to read the process recipe from the memory device 121*c* according to an instruction such as an operation command inputted from the input/output device 122.

According to the contents of the process recipe read from the memory device 121*c*, the CPU 121*a* may be configured to control various operations such as flow rate adjusting operations for various gases by the MFCs 320*a* through 320*g*, opening/closing operations of the valves 330*a* through 330*g*, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor, an operation of adjusting rotation and rotation speed of the boat 217 by the boat rotating mechanism 267 and an elevating and lowering operation of the boat 217 by the boat elevator 115.

While the embodiments will be described by way of an example in which the controller 280 is embodied by a dedicated computer system, the controller 280 is not limited to the dedicated computer system. For example, the controller 280 may be embodied by a general computer system. For example, the controller 280 may be embodied by preparing an external memory device 123 storing the above-described program and installing the program stored in the external memory device 123 into the general computer system. For example, the external memory device 123 may include a magnetic disk such as a hard disk, an optical disk such as a CD, a magneto-optical disk such as an MO and a semiconductor memory such as a USB memory.

Operation

Figure 8:
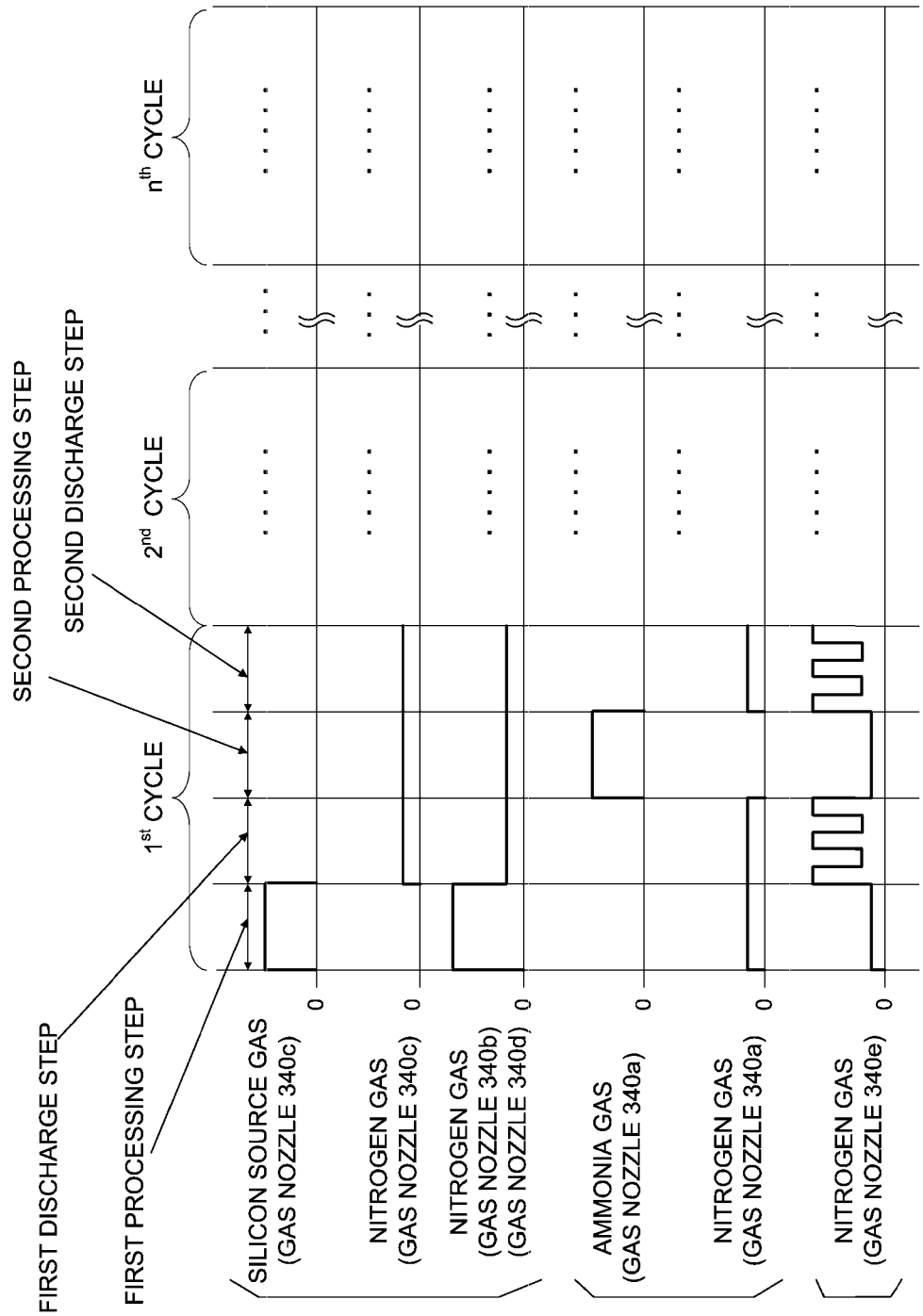
FIG. 8 illustrates a film-forming sequence of the substrate processing apparatus according to the embodiments.

Hereinafter, the operation of the substrate processing apparatus 10 according to the embodiments will be described according to a control procedure performed by the controller 280 using a film-forming sequence (also referred to as the "substrate processing") shown in FIG. 8. The vertical axis of the graphs shown in FIG. 8 represents supply amounts of the gases in the film-forming sequence according to the embodiments, and the horizontal axes of the graphs shown in FIG. 8 represents supply timings of the gases in the film-forming sequence according to the embodiments. The boat 217 with a predetermined number of the plurality of the wafers including the wafer 200 accommodated therein is transferred (loaded) into the reaction tube 203 in advance, and the reaction tube 203 is airtightly closed by the seal cap 219.

When the control of the components by the controller 280 is started, the controller 280 controls the vacuum pump 246 and the APC valve 244 shown in FIG. 2 to exhaust an inner atmosphere of the reaction tube 203 through the exhaust port 230. In addition, the controller 280 controls the boat rotating mechanism 267 to start the rotation of the boat 217 and the plurality of the wafers including the wafer 200 accommodated in the boat 217. The boat rotating mechanism 267 continuously rotates the boat 217 and the plurality of the wafers including the wafer 200 until at least the processing of the wafers 200 is completed.

In the film-forming sequence shown in FIG. 8, the film-forming on the wafer 200 is completed by performing (repeating) a cycle a predetermined number of times. For example, the cycle includes a first processing step, a first discharge step, a second processing step and a second discharge step. When the film-forming is completed, the boat 217 is transferred (unloaded) out of the reaction tube 203 in the order reverse to that of the loading of the boat 217 described above. In addition, the plurality of the wafers including the wafer 200 is transferred from the boat 217 to a pod of a transfer shelf (not shown) by a wafer transfer mechanism (not shown), and the pod is transferred from the transfer shelf to a pod stage by a pod transfer mechanism (not shown). Then, the pod is transferred to the outside of a housing of the substrate processing apparatus 10 by an external transfer mechanism (not shown).

Hereinafter, the cycle of the film-forming sequence will be described. The valves 330a, 330b, 330c, 330d, 330e, 330f and 330g are closed before performing the cycle of the film-forming sequence.

First Processing Step

When the inner atmosphere of the reaction tube 203 is exhausted through the exhaust port 230 by the control of each component by the controller 280, the valves 330b, 330c and 330d are opened by the control of the controller 280 to eject the silicon (Si) source gas serving as the second source gas through the plurality of the ejection holes 234c of the gas nozzle 340c. As shown in FIG. 8, the inert gas (nitrogen gas) serving as an assist gas is ejected through the plurality of the ejection holes 234b of the gas nozzle 340b and the plurality of the ejection holes 234d of the gas nozzle 340d (see FIG. 8). That is, by the control of the controller 280, the process gases are ejected through the plurality of the ejection holes 234b of the gas nozzles 340b, the plurality of the ejection holes 234c of the gas nozzles 340c and the plurality of the ejection holes 234d of the gas nozzles 340d disposed in the second nozzle chamber 222b.

The valves 330f and 330e are opened by the control of the controller 280 to eject the inert gas (nitrogen gas) serving as a backflow prevention gas through the plurality of the ejection holes 234a of the gas nozzle 340a and the plurality of the ejection holes 234e of the gas nozzle 340e.

In the first processing step, the controller 280 controls the operations of the vacuum pump 246 and the APC valve 244 to discharge the inner atmosphere of the reaction tube 203 through the exhaust port 230 while maintaining the pressure obtained (measured) from the pressure sensor 245 to be constant such that the inner pressure of the reaction tube 203 is lower than the atmospheric pressure. Thereby, the second source gas flows in a direction parallel to the upper surfaces of the plurality of the wafers including the wafer 200, then flows from an upper portion of the gap S to a lower portion of the gap S through the first exhaust port 236 and the second exhaust port 237. Then, the second source gas is exhausted through the exhaust port 230 and the exhaust pipe 231.

In the first processing step, the controller 280 controls the supply amounts of the gases by the MFC 320b, MFC 320c and MFC 320d, respectively. Specifically, the controller 280 controls the MFC 320b, MFC 320c and MFC 320d such that the supply amount of the assist gas ejected through the plurality of the ejection holes 234b and the supply amount of the assist gas ejected through the plurality of the ejection holes 234d are greater than the supply amount of the second source gas ejected through the plurality of the ejection holes 234c, respectively. The assist gas is a kind of carrier gas in a broad sense, and is to assist the flow (movement) of a source gas such as the second source gas so that the source gas such as the second source gas flows along a preferred flow path and/or with a preferred flow rate. The assist gas not only assists in supplying the source gas such as the second source gas but also may assist in supplying materials derived from the source gas such as second source gas or removing (discharging) the unreacted source gas such as the second source gas or reaction products.

According to the embodiments, at least one of the supply amount and the flow rate of the assist gas are greater than that of the second source gas. The supply amounts of the assist gas supplied through the gas nozzles 340b and 340d may be 0.1 times to 500 times the supply amount of the source gas such as the second source gas, respectively. Preferably, the supply amounts of the assist gas supplied through the gas nozzles 340b and 340d is greater than the supply amount of the source gas, respectively. In addition, preferably, the flow velocity of the assist gas when the assist gas is supplied to the process chamber 201 is faster than the flow velocity of the source gas when the source gas is supplied to the process chamber 201. For example, the assist gas having a large flow rate of about 1 slm has a flow velocity of about 10 m/s in the process chamber 201 at a pressure of 10 Pa.

As described above, the plurality of the ejection holes 234b, the plurality of the ejection holes 234c and the plurality of the ejection holes 234d are configured to have a shape of a pinhole, and the ejection directions in which the process gases are ejected through the plurality of the ejection holes 234b, the plurality of the ejection holes 234c and the plurality of the ejection holes 234d are all the same. In other words, the ejection direction of the assist gas ejected through the plurality of the ejection holes 234b and plurality of the ejection holes 234d of a pair of the gas nozzles 340b and 340d is parallel to the ejection direction of the second source gas ejected through the plurality of the ejection holes 234c of the gas nozzle 340c.

In addition, when a jet flow having a high flow velocity is used, it is possible to increase a ratio of the flow velocity of the gases by the macroscopic advection (forced convection) to the movement velocity of the gases by the diffusion. When the ratio is greater than 1, the advection will be dominant in the gas substitution in the process chamber 201, and the gas substitution will be performed in a shorter time. In order to shorten the process time, it is preferable to make the ratio larger than 1 by the assist gas. It is also effective in reducing the time required for the gas substitution in components such as a via and a trench formed on a patterned surface when film-forming process is performed on the patterned surface with a high aspect ratio.

However, when the jet flow is applied to a structure in which only one nozzle is provided in one nozzle chamber to supply the gas as in the conventional structure, vortex or turbulence is generated by an increase in the Reynolds numbers, or it becomes difficult to ensure a positive flow rate in the range of the width of the plurality of the supply slits 235. Therefore, the gas ejected through the nozzle of the nozzle chamber may return to the nozzle chamber again. At that time, gases coming from different nozzle chambers may be mixed with each other.

First Discharge Step

When the first processing step is completed after a predetermined time has elapsed, the valve 330c is closed by the control of the controller 280 to stop the supply of the second source gas through the gas nozzle 340c. The opening degrees of the valve 330b and the valve 330d are reduced by the control of the controller 280 to eject the inert gas (nitrogen gas) serving as the backflow prevention gas through the plurality of the ejection holes 234b and the plurality of the ejection holes 234d of the gas nozzle 340b and the gas nozzle 340d. In addition, the valve 330g is opened by control of the controller 280 to eject the inert gas (nitrogen gas) serving as the backflow prevention gas through the plurality of the ejection holes 234c of the gas nozzle 340c.

The controller 280 also controls the operations of the vacuum pump 246 and the APC valve 244 to exhaust the inner atmosphere of the reaction tube 203 through the exhaust port 230, for example, by increasing the degree of a negative pressure in the reaction tube 203. At the same time, the valve 330e is intermittently opened widely by the control of the controller 280 to supply the inert gas (nitrogen gas) serving as a purge gas through the plurality of the ejection holes 234e of the gas nozzle 340e into the process chamber 201 and to purge the gases staying in the reaction tube 203 through the exhaust port 230.

Second Processing Step

When the first discharge step is completed after a predetermined time has elapsed, the valve 330a is opened by the control of the controller 280 to eject the ammonia (NH₃) gas serving as the first source gas through the plurality of the ejection holes 234a of the gas nozzle 340a. The valve 330f is closed by the control of the controller 280 to stop the supply of the inert gas (nitrogen gas) serving as the backflow prevention gas.

In addition, the intermittent operation of the valve 330e is stopped by the control of the controller 280 to eject the inert gas (nitrogen gas) serving as the backflow prevention gas through the plurality of the ejection holes 234e of the gas nozzle 340e.

In the second processing step, the controller 280 controls the operations of the vacuum pump 246 and the APC valve 244 to discharge the inner atmosphere of the reaction tube 203 through the exhaust port 230 while maintaining the pressure obtained (measured) from the pressure sensor 245 to be constant such that the inner pressure of the reaction tube 203 becomes a negative pressure.

Thereby, the first source gas flows in a direction parallel to the upper surfaces of the plurality of the wafers including the wafer 200, then flows from the upper portion of the gap S to the lower portion of the gap S through the first exhaust port 236 and the second exhaust port 237. Then, the first source gas is exhausted through the exhaust port 230 and the exhaust pipe 231.

Second Discharge Step

When the second processing step is completed after a predetermined time has elapsed, the valve 330a is closed by the control of the controller 280 to stop the supply of the first source gas through the gas nozzle 340a. The valve 330f is opened by control of the controller 280 to eject the inert gas (nitrogen gas) serving as the backflow prevention gas through the plurality of the ejection holes 234a of the gas nozzle 340a.

The controller 280 also controls the operations of the vacuum pump 246 and the APC valve 244 to exhaust the inner atmosphere of the reaction tube 203 through the exhaust port 230, for example, by increasing the degree of the negative pressure in the reaction tube 203. At the same time, the valve 330e is intermittently opened widely by the control of the controller 280 to supply the inert gas (nitrogen gas) serving as the purge gas through the plurality of the ejection holes 234e of the gas nozzle 340e into the process chamber 201 and to purge the gases staying in the reaction tube 203 through the exhaust port 230.

As described above, by performing (repeating) the cycle including the first processing step, the first discharge step, the second processing step and the second discharge step a predetermined number of times, the processing of the wafer 200 is completed.

Recapitulation

As described above, the gas nozzle 340c through which the second source gas flows is disposed in the second nozzle chamber 222b of the substrate processing apparatus 10, and the gas nozzles 340b and 340d through which the inert gas (nitrogen gas) serving as the assist gas flows are also disposed in the second nozzle chamber 222b of the substrate processing apparatus 10. In addition, the gas nozzles 340b, 340c and 340d are fluidly connected to the gas supply sources 360b, 360c and 360d, respectively and independently, by the gas supply pipes 310b, 310c and 310d, respectively. Therefore, it is possible to control (adjust) the supply amount of the gas ejected through the plurality of the ejection holes 234b of the gas nozzle 340b, the supply amount of the gas ejected through the plurality of the ejection holes 234c of the gas nozzle 340c and the supply amount of the gas ejected through the plurality of the ejection holes 234d of the gas nozzle 340d, respectively.

As described above, the gas nozzle 340c is interposed between the gas nozzle 340b and the gas nozzle 340d along the circumferential direction of the process chamber 201. Therefore, as compared with the case where the source gas (second source gas) and the carrier gas are always ejected toward the process chamber 201 through the same ejection holes of the same gas nozzle, it is possible to supply the source gas onto the plurality of the wafers including the wafer 200 while maintaining a high concentration without dilution. In addition, it is possible to expand a control range of the thickness of the film formed on the surfaces of the plurality of the wafers.

As described above, the MFC 320b, 320c and 320d are provided at the gas supply pipes 310b, 310c and 310d, respectively. Therefore, it is possible to control (adjust) the balance among the supply amount of the gas ejected through plurality of the ejection holes 234b of the gas nozzle 340b, the supply amount of the gas ejected through the plurality of the ejection holes 234c of the gas nozzle 340c and the supply amount of the gas ejected through the plurality of the ejection holes 234d of the gas nozzle 340d. Thereby, as compared with the case where the MFCs are not provided in the respective gas supply pipes, it is possible to control (adjust) the thickness of the film formed on the surfaces of the plurality of the wafers including the wafer 200 to have either a convex distribution and a concave distribution, and to suppress the deviation in the thickness of the film at a high precision. It is also possible to control a convexity of the thickness of the film by making the flow ratio of the gas nozzle 340b and the gas nozzle 340d different.

As described above, the controller 280 controls the MFC 320b, MFC 320c and MFC 320d such that the supply amount of the assist gas ejected through the plurality of the ejection holes 234b and the supply amount of the assist gas ejected through the plurality of the ejection holes 234d are greater than the supply amount of the source gas (second source gas) ejected through the plurality of the ejection holes 234c. As described above, the assist gas can prevent the flow of the source gas from spreading, and the source gas can reach the centers of the plurality of the wafers including the wafer 200 by supplying the source gas and the assist gas through the second nozzle chamber 222b while the supply amount of the assist gas is greater than that of the source gas and the assist gas propagates between the source gas, as indicated by arrows shown in FIG. 1. Therefore, as compared with the case where the supply of the source gas tends to be insufficient at the centers of the plurality of the wafers, it is possible to suppress the deviation in the thickness of the film formed on the surfaces of the plurality of the wafers including the wafer 200.

As described above, the plurality of the ejection holes 234b, the plurality of the ejection holes 234c and the plurality of the ejection holes 234d are provided at the gas nozzles 340b, 340c and 340d, respectively, such that the ejection direction of the assist gas ejected through the plurality of the ejection holes 234b and the plurality of the ejection holes 234d of the pair of the gas nozzles 340b and 340d is substantially parallel to the ejection direction of the source gas (second source gas) ejected through the plurality of the ejection holes 234c of the gas nozzle 340c. The term "substantially parallel" may also include a state in which the ejection directions described above are not exactly parallel to each other but inclined slightly inward from the exactly parallel direction toward the centers of the plurality of the wafers.

Thereby, jet flows (preferably, laminar jet flows) are formed by the gases ejected through the plurality of the ejection holes 234b, the plurality of the ejection holes 234c and the plurality of the ejection holes 234d. The parallel jet flows from the plurality of the ejection holes 234b and the plurality of the ejection holes 234d draw each other to cause attraction (Coanda effect), and converge (that is, the distance between the parallel jet flows is decreased). Therefore, it is possible to suppress the spread of the velocity distribution of the source gas disposed between the parallel jet flows. As a result, the source gas can effectively reach the centers of the plurality of the wafers including the wafer 200. Therefore, it is possible to suppress the deviation in the thickness of the film formed on the surfaces of the plurality of the wafers including the wafer 200, as compared with the case in which the ejection directions are different from each other. In addition, when the flow velocity of the inert gas ejected through the plurality of the ejection holes 234b and the plurality of the ejection holes 234d is fast enough, the initial velocity of ejecting the source gas may be low since the source gas (second source gas) is also supplied together with the inert gas. In a case where the initial velocity of ejecting the source gas is low, the openings of the plurality of the ejection holes 234c may be greater than those of the plurality of the ejection holes such as the plurality of the ejection holes 234b. For example, instead of the plurality of the ejection holes 234c, an ejection hole 234c configured as a longitudinally elongated slit that is opened toward all of the plurality of the wafers including the wafer 200 may be used.

When one of the plurality of the support columns 217a faces the gas nozzles 340b, 340c and 340d as the boat 217 rotates, the flow rates from the gas nozzles 340b, 340c and 340d may be actively changed by controlling the MFCs 320b, 320c and 320d. For example, the assist gas flowing through the gas nozzles 340b or 340d is reduced more than usual only when one of the gas nozzle 340b or the gas nozzle 340d comes closest to the one of the plurality of the support columns 217a so that the source gas (second source gas) from the gas nozzle 340c can easily flow around behind the plurality of the support columns 217a with the aid of the other gas nozzle 340d or 340b. At this time, in order to maintain the total flow rate of the inert gas flowing into the process chamber 201 to be constant, the flow rate of the gases ejected through the other of the gas nozzles 340b and 340d may be increased, or the flow rate of the gases ejected through the gas nozzles 340a and 340e may be increased. Therefore, it is possible to prevent the thickness of the film formed on the plurality of the wafers including the wafer 200 from becoming relatively thin in the vicinity of the plurality of the support columns 217a.

The second source gas is often decomposed more easily than the first source gas, or has higher reactivity than the first source gas. Therefore, it may be difficult to supply the second source gas with a good uniformity to the entire surface of the wafer 200 by the method same as that used for as the first source gas. However, by supplying a large flow rate of the nitrogen gas that is not likely to be heated by the radiation through the gas nozzles 340b and 340d, it is possible to suppress the decomposition of the second source gas by lowering the temperature of the second source gas. It is also possible to supply the second source gas uniformly and to reduce particles generated by the decomposition of the second source gas.

First Modified Example

Hereinafter, an example of a substrate processing apparatus 510 according to a first modified example of the embodiments will be described with reference to FIG. 9. The differences between the substrate processing apparatus 510 according to the first modified example and the substrate processing apparatus 10 according to the original embodiments will be mainly described. Components of the substrate processing apparatus 510 that are the same as the components of the substrate processing apparatus 10 according to the original embodiments will be denoted by the same reference numerals, and detailed description thereof will be omitted.

Figure 9:
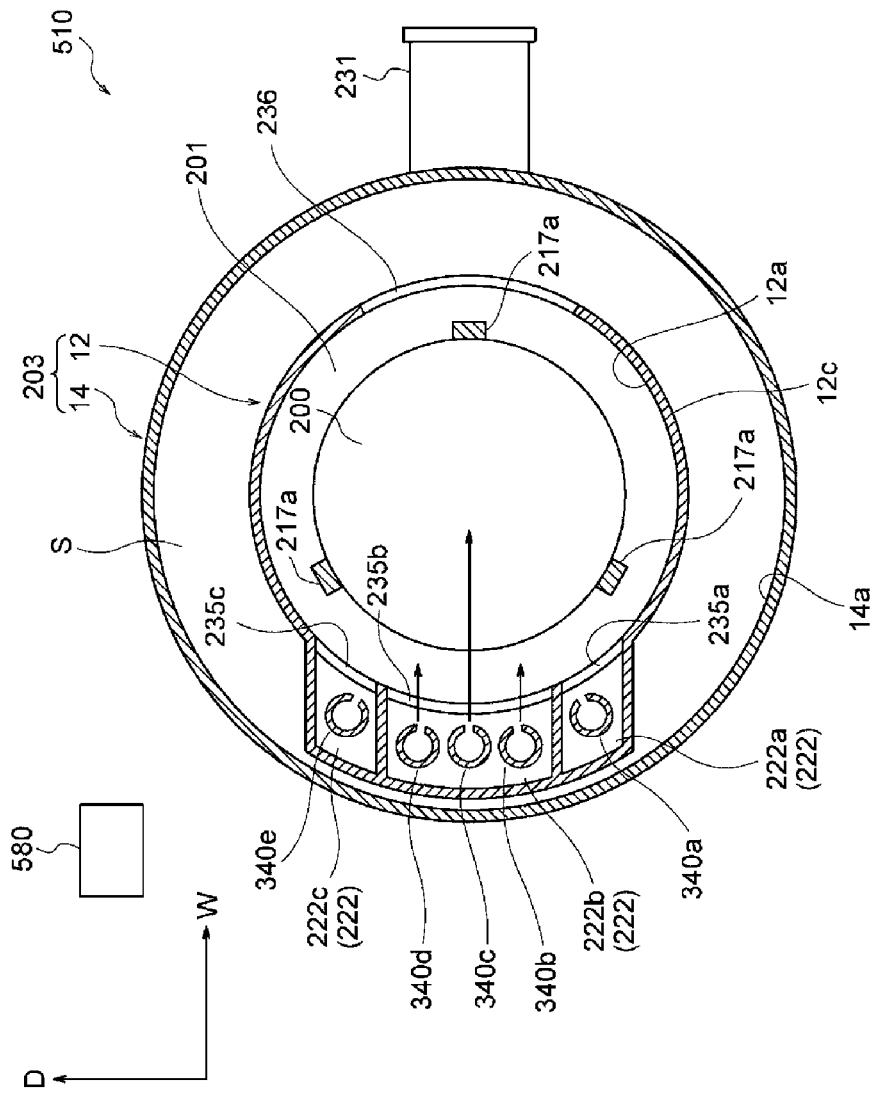
FIG. 9 schematically illustrates a horizontal cross-section of a substrate processing apparatus according to a first modified example of the embodiments.

As shown in FIG. 9, similar to the substrate processing apparatus 10, the gas nozzle 340c through which the second source gas flows and the pair of the gas nozzles 340b and 340d through which the inert gas flows are disposed in the second nozzle chamber 222b of the substrate processing apparatus 510. The pair of the gas nozzles 340b and 340d is disposed with the gas nozzle 340c interposed therebetween.

In the first processing step of the film-forming sequence according to the first modified example, the valves 330b, 330c and 330d shown in FIG. 2 are opened by the control of a controller 580 of the substrate processing apparatus 510. The silicon (Si) source gas serving as the second source gas is ejected through the plurality of the ejection holes 234c of the gas nozzle 340c, and the inert gas (nitrogen gas) serving as the backflow prevention gas is ejected through the plurality of the ejection holes 234b of the gas nozzle 340b and the plurality of the ejection holes 234d of the gas nozzle 340d, by the control of the controller 580, as indicated by arrows shown in FIG. 9. Specifically, the flow rates of the inert gas (nitrogen gas) ejected through the plurality of the ejection holes 234b of the gas nozzle 340b and the plurality of the ejection holes 234d of the gas nozzle 340d are adjusted to a minimum amount necessary to prevent the first and second source gases supplied into the process chamber 201 from flowing into the second nozzle chamber 222b.

That is, by ejecting the inert gas (nitrogen gas) with a flow rate sufficiently small without forming the jet flows (for example, a flow rate less than 1 times the flow rate of the second source gas) through the plurality of the ejection holes 234b and the plurality of the ejection holes 234d of the pair of the gas nozzles 340b and 340d, it is possible to form laminar flows (for example, having the Reynolds number of 1 or less) toward the process chamber 201 in the vicinity of both sides of the plurality of the supply slits 235b. Therefore, it is possible to prevent a return flow of the gas ejected out of the second nozzle chamber 222b from flowing into the second nozzle chamber 222b again.

As a result, it is possible to suppress the generation of the particles in the second nozzle chamber 222b. By suppressing the return flow, it is also possible to prevent other gases such as other source gases in the process chamber 201 mixed in the return flow from flowing into or diffusing into the second nozzle chamber 222b. Therefore, it is possible to suppress the particles themselves.

According to the first modified example, the supply amount of the inert gas through the gas nozzles 340b and 340d is much smaller than that of the original embodiments, it is possible to suppress the dilution of the second source gas. Since the material transport is mainly performed by the diffusion during the supply of the second source gas (the first processing step), it is possible to suppress the deviation in the thickness of the film formed on the surfaces of the plurality of the wafers including the wafer 200 in certain processes.

Second Modified Example

Hereinafter, an example of a substrate processing apparatus 610 according to a second modified example of the embodiments will be described with reference to FIGS. 10 and 11. The differences between the substrate processing apparatus 610 according to the second modified example and the substrate processing apparatus 10 according to the original embodiments will be mainly described. Components of the substrate processing apparatus 610 that are the same as the components of the substrate processing apparatus 10 according to the original embodiments will be denoted by the same reference numerals, and detailed description thereof will be omitted. The substrate processing apparatus 610 includes a first nozzle chamber 622a corresponding to the first nozzle chamber 222a of the original embodiments, a second nozzle chamber 622b corresponding to the second nozzle chamber 222b of the original embodiments and a third nozzle chamber 622c corresponding to the third nozzle chamber 222c. The circumferential lengths of the first nozzle chamber 622a, the second nozzle chamber 622b and the third nozzle chamber 622c are substantially equal to those of the first nozzle chamber 222a, the second nozzle chamber 222b and the third nozzle chamber 222c, respectively.

Second Nozzle Chamber 622

Figure 10:
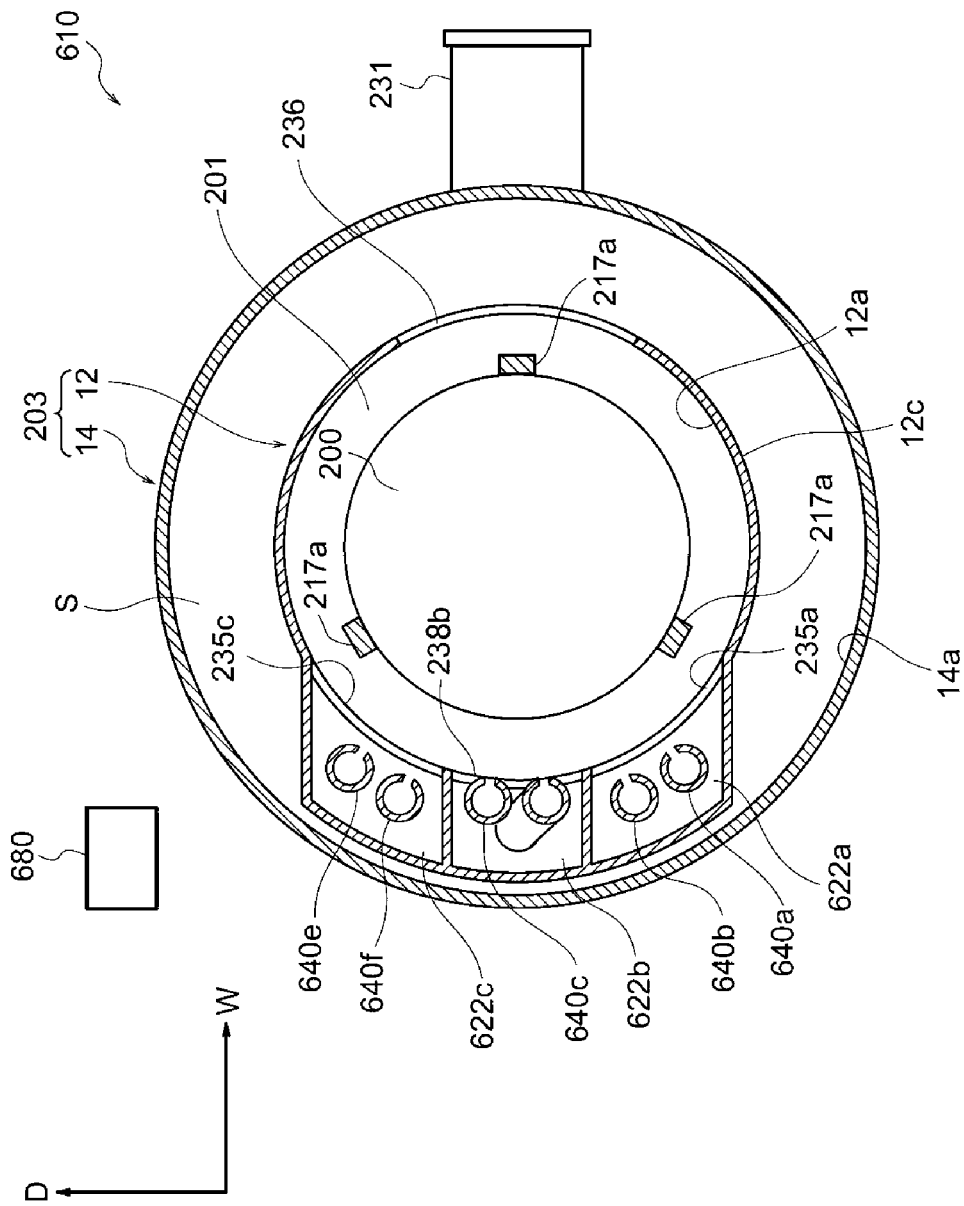
FIG. 10 schematically illustrates a horizontal cross-section of a substrate processing apparatus according to a second modified example of the embodiments.
Figure 11:
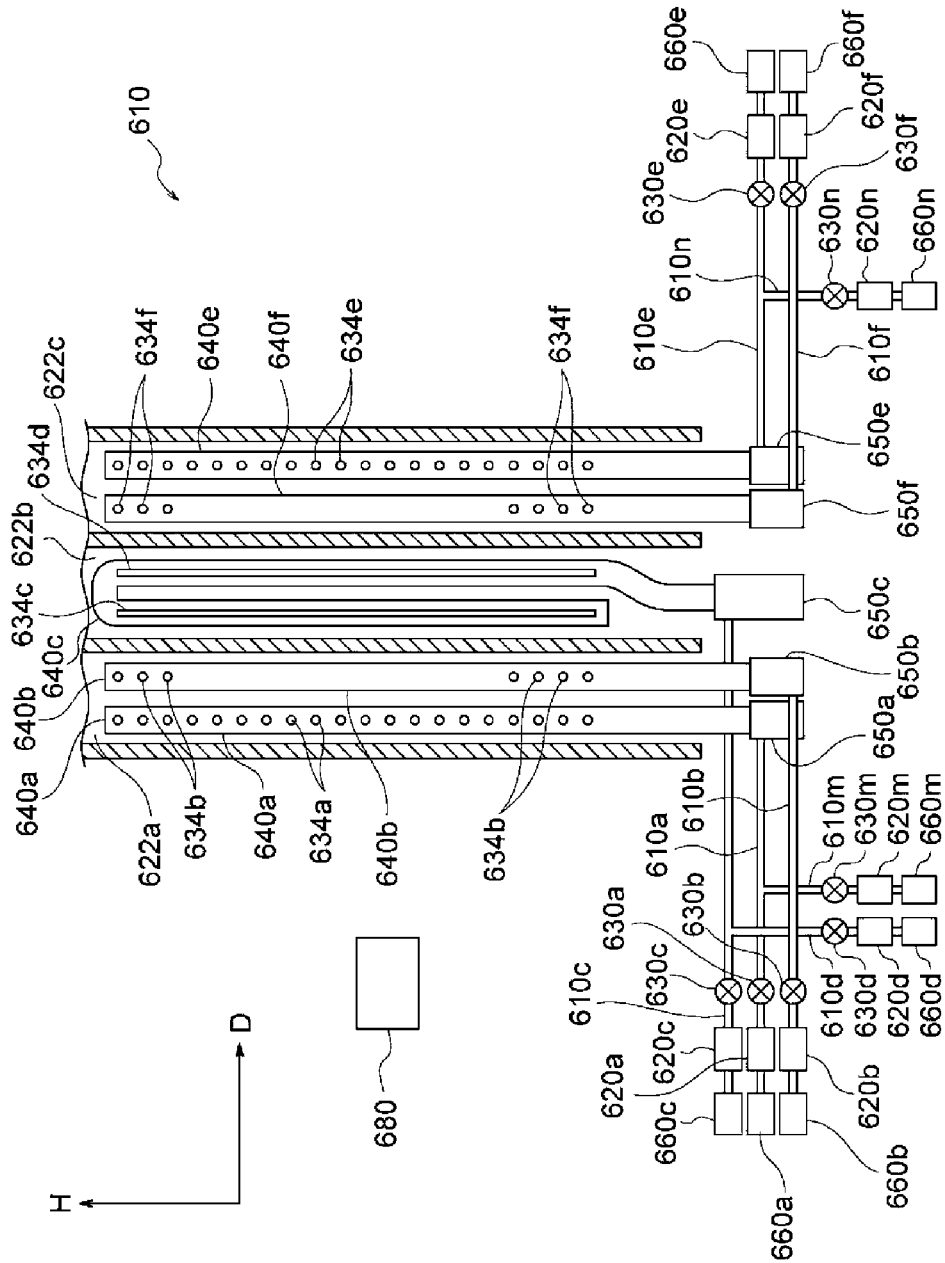
FIG. 11 schematically illustrates a vertical cross-section of the substrate processing apparatus according to the second modified example of the embodiments.

As shown in FIGS. 10 and 11, instead of the plurality of the supply slits 235b of the original embodiments, the second nozzle chamber 622b is provided with a continuous opening 238b corresponding to the plurality of the wafers including the wafer 200. In addition, a U-shaped gas nozzle 640c folded at an upper end portion thereof is disposed in the second nozzle chamber 622b. A discharge hole 634c and a discharge hole 634d, which have a shape of a horizontally elongated slit in the vertical direction, are provided on a side surface of the gas nozzle 640c. The discharge holes 634c and 634d in two pipes extending in the vertical direction and defined by the U-shaped gas nozzle 640c are open toward the central axis of the process chamber 201, respectively. A range in which the discharge hole 634c and the discharge hole 634d are arranged in the vertical direction covers a range in which the plurality of the wafers including the wafer 200 is arranged in the vertical direction.

As shown in FIG. 11, the gas nozzle 640c extends vertically from a lower end thereof supported by a nozzle support 650c. Then, the gas nozzle 640c is bent in the circumferential direction and the radial direction of the process chamber 201 to approach the central axis of the process chamber 201, and then extends vertically again.

Then the gas nozzle 640c is bent by 180°, and extends downward vertically in the vicinity of the bent portion of the gas nozzle 640c. As a result, the contour of the gas nozzle 640c can reach the opening 238b. For example, the distances from the central axis of the reaction tube 203 to the discharge holes 634c and 634d are equal to a radius of the inner circumferential surface of the inner tube 12. A nozzle described above such as the gas nozzle 640c may be referred to as a "forward-leaning nozzle". A lower end of the opening 238b is set sufficiently lower than the lowermost wafer among the plurality of the wafers in order to prevent the opening 238b from contacting the gas nozzle 640c.

A gas supply pipe 610c is connected to the nozzle support 650c configured to support the gas nozzle 640c. A source gas supply source 660c for supplying the second source gas (silicon source gas), a mass flow controller (MFC) 620c and a valve 630c serving as an opening/closing valve are sequentially provided at the gas supply pipe 610c from the upstream side toward the downstream side in the gas flow direction.

A gas supply pipe 610d configured to supply the inert gas is connected to the gas supply pipe 610c at a downstream side of the valve 630c. An inert gas supply source 660d for supplying the inert gas, a mass flow controller (MFC) 620d and a valve 630d are sequentially provided at the gas supply pipe 610d from the upstream side toward the downstream side in the gas flow direction.

First Nozzle Chamber 622a

As shown in FIGS. 10 and 11, a gas nozzle 640a and a gas nozzle 640b are disposed in the first nozzle chamber 622a. The gas nozzle 640b is disposed closer to the second nozzle chamber 622b than the gas nozzle 640a is. At the gas nozzle 640a, a plurality of pinhole-shaped ejection holes 634a is arranged in the vertical direction at the same intervals. A range in which the plurality of the ejection holes 634a is arranged in the vertical direction covers the range in which the plurality of the wafers including the wafer 200 is arranged in the vertical direction. In addition, the plurality of the ejection holes 634a is provided so as to face the plurality of the supply slits 235a, respectively.

A gas supply pipe 610a is connected to a nozzle support 650a configured to support the gas nozzle 640a. A source gas supply source 660a for supplying the first source gas (ammonia gas), a mass flow controller (MFC) 620a and a valve 630a serving as an opening/closing valve are sequentially provided at the gas supply pipe 610a from the upstream side toward the downstream side in the gas flow direction.

A gas supply pipe 610m configured to supply the inert gas (nitrogen gas) is connected to the gas supply pipe 610a at a downstream side of the valve 630a. An inert gas supply source 660m for supplying the inert gas (nitrogen gas), a mass flow controller (MFC) 620m and a valve 630m are sequentially provided at the gas supply pipe 610m from the upstream side toward the downstream side in the gas flow direction.

At the gas nozzle 640b, a plurality of pinhole-shaped ejection holes 634a is arranged in the vertical direction at an upper portion of the gas nozzle 640b and a lower portion of the gas nozzle 640b. A range in which the plurality of the ejection holes 634b is arranged at the upper portion of the gas nozzle 640b covers a range in which the uppermost wafer among the plurality of the wafers is arranged in the vertical direction, and a range in which the plurality of the ejection holes 634b is provided at the lower portion of the gas nozzle 640b covers a range in which the lowermost wafer among the plurality of the wafers is arranged in the vertical direction. In addition, the plurality of the ejection holes 634b is provided so as to face the plurality of the supply slits 235a, respectively.

A gas supply pipe 610b is connected to a nozzle support 650b configured to support the gas nozzle 640b. An inert gas supply source 660b for supplying the inert gas (nitrogen gas), a mass flow controller (MFC) 620b and a valve 630b serving as an opening/closing valve are sequentially provided at the gas supply pipe 610b from the upstream side toward the downstream side in the gas flow direction.

Third Nozzle Chamber 622c

As shown in FIGS. 10 and 11, a gas nozzle 640e and a gas nozzle 640f are disposed in the third nozzle chamber 622c. The gas nozzle 640f is disposed closer to the second nozzle chamber 622b than the gas nozzle 640e is. At the gas nozzle 640e, a plurality of pinhole-shaped ejection holes 634e is arranged in the vertical direction at the same intervals. A range in which the plurality of the ejection holes 634e is arranged in the vertical direction covers the range in which the plurality of the wafers including the wafer 200 is arranged in the vertical direction. In addition, the plurality of the ejection holes 634e is provided so as to face the plurality of the supply slits 235c, respectively.

A gas supply pipe 610e is connected to a nozzle support 650e configured to support the gas nozzle 640e. A source gas supply source 660e for supplying the first source gas (ammonia gas), a mass flow controller (MFC) 620e and a valve 630e serving as an opening/closing valve are sequentially provided at the gas supply pipe 610e from the upstream side toward the downstream side in the gas flow direction.

A gas supply pipe 610n configured to supply the inert gas (nitrogen gas) is connected to the gas supply pipe 610e at a downstream side of the valve 630e. An inert gas supply source 660n for supplying the inert gas (nitrogen gas), a mass flow controller (MFC) 620n and a valve 630n are sequentially provided at the gas supply pipe 610n from the upstream side toward the downstream side in the gas flow direction.

At the gas nozzle 640f, a plurality of pinhole-shaped ejection holes 634f is arranged in the vertical direction at an upper portion of the gas nozzle 640f and a lower portion of the gas nozzle 640f. A range in which the plurality of the ejection holes 634f is arranged at the upper portion of the gas nozzle 640f covers the range in which the uppermost wafer among the plurality of the wafers is arranged in the vertical direction, and a range in which the plurality of the ejection holes 634f is arranged at the lower portion of the gas nozzle 640f covers the range in which the lowermost wafer among the plurality of the wafers is arranged in the vertical direction. In addition, the plurality of the ejection holes 634f is provided so as to face the plurality of the supply slits 235c, respectively.

A gas supply pipe 610f is connected to a nozzle support 650f configured to support the gas nozzle 640f. An inert gas supply source 660f for supplying the inert gas (nitrogen gas), a mass flow controller (MFC) 620f and a valve 630f serving as an opening/closing valve are sequentially provided at the gas supply pipe 610f from the upstream side toward the downstream side in the gas flow direction.

Operation

In the first processing step of the film-forming sequence according to the second modified example, the valves 630c and 630d are opened by the control of a controller 680 of the substrate processing apparatus 610, and the silicon source gas serving as the second source gas is ejected through the discharge hole 634c and the discharge hole 634d of the gas nozzle 640c serving as a second nozzle, by the control of the controller 680. The valves 630m and 630n are opened by the control of the controller 680, and the inert gas (nitrogen gas) is ejected through the plurality of the ejection holes 634a and the plurality of the ejection holes 634e of the gas nozzles 640a and 640e collectively serving as a first nozzle, by the control of the controller 680. By ejecting the inert gas, it is possible to prevent the gases from being introduced into the first nozzle chamber 622a or the third nozzle chamber 622c from the process chamber 201. An inert gas barrier is formed to the vicinity of the opening 238b. Thus, even when the vertex is generated near the opening 238b, it is possible to suppress the gas other than the inert gas from being introduced into the first nozzle chamber 622b along the inner circumferential surface 12a.

In the second processing step of the film-forming sequence according to the second modified example, the valves 630a and 630e are opened by the control of the controller 680, and the ammonia gas serving as the first source gas is ejected through the plurality of the ejection holes 634a of the gas nozzle 640a and the plurality of the ejection holes 634e of the gas nozzle 640e, by the control of the controller 680.

In the second modified example, the silicon source gas ejected through the discharge holes 634c and 634d or the ammonia gas ejected through the plurality of the ejection holes 634a and the plurality of the ejection holes 634e may exist as a surplus gas in an uppermost region of the vertically arranged wafers and a lowermost region of the vertically arranged wafers, and the film formed on wafers disposed in the uppermost region and the lowermost region may become thick. However, according to the second modified example, the valves 630b and 630f are opened by the control of the controller 680, and the inert gas (nitrogen gas) is ejected through the plurality of the ejection holes 634b and the plurality of the ejection holes 634f of the gas nozzles 640b and 640f collectively serving as a third nozzle so as to dilute or to purge the surplus gas, by the control of the controller 680. The opening degrees of the valves 630b and 630f are determined based on information of the amount of the surplus gas obtained in advance.

As a result, it is possible to suppress the deviation in the supply amount of the gases to the plurality of the wafers including the wafer 200 aligned in the vertical direction, and it is also possible to decrease the deviation in the thicknesses of the film between the plurality of the wafers.

According to the second modified example, by providing the discharge holes 634c and 634d close to the plurality of the wafers, it is possible to easily transfer the silicon source gas to the centers of the plurality of the wafers including the wafer 200 even at a relatively low flow rate. In addition, by suppressing the generation of the vertex and by causing the vertex to be generated at a position far from the opening 238b even when the vertex is generated, it is possible to prevent the gases from being introduced into the nozzle chamber 622b from the process chamber 201. By supplying the assist gas through the gas nozzle 640a or the gas nozzle 640e similar to the original embodiments or the first modified example, it is possible to control the distribution of the thickness of the film. That is, since the assist gas supplied through the components such as the gas nozzle 640a flows along the outer edges of the plurality of the wafers including the wafer 200 in the process chamber 201, the distribution of the thickness of the film can be made convex as the flow rate of the assist gas is increased.

Third Modified Example

Hereinafter, an example of a substrate processing apparatus 710 according to a third modified example of the embodiments will be described with reference to FIGS. 12A, 12B and 13. The differences between the substrate processing apparatus 710 according to the third modified example and the substrate processing apparatus 10 according to the original embodiments will be mainly described. Components of the substrate processing apparatus 710 that are the same as the components of the substrate processing apparatus 10 according to the original embodiments will be denoted by the same reference numerals, and detailed description thereof will be omitted.

Figure 12:
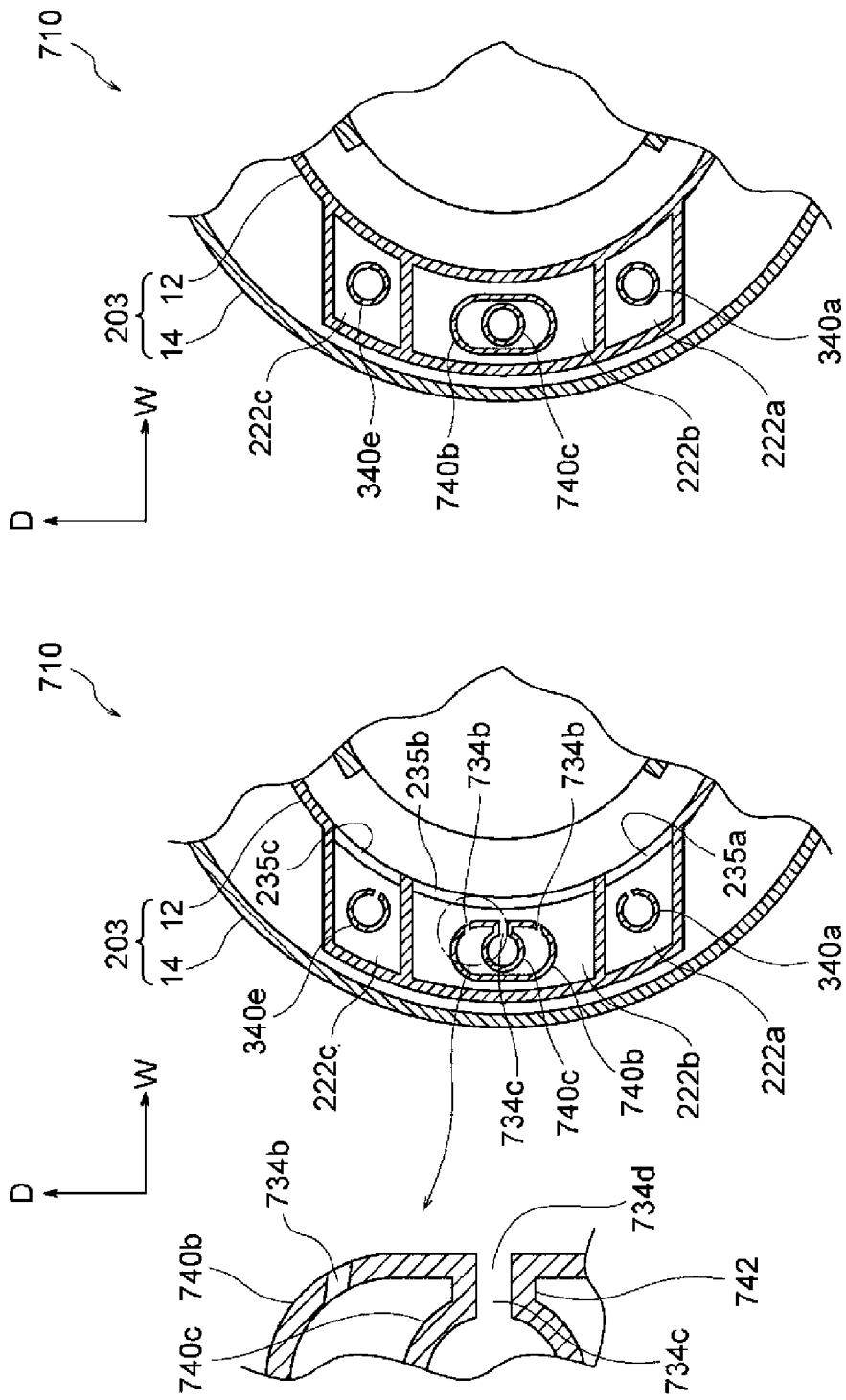
FIGS. 12A and 12B schematically illustrate a horizontal cross-section of a substrate processing apparatus according to a third modified example of the embodiments.
Figure 13:
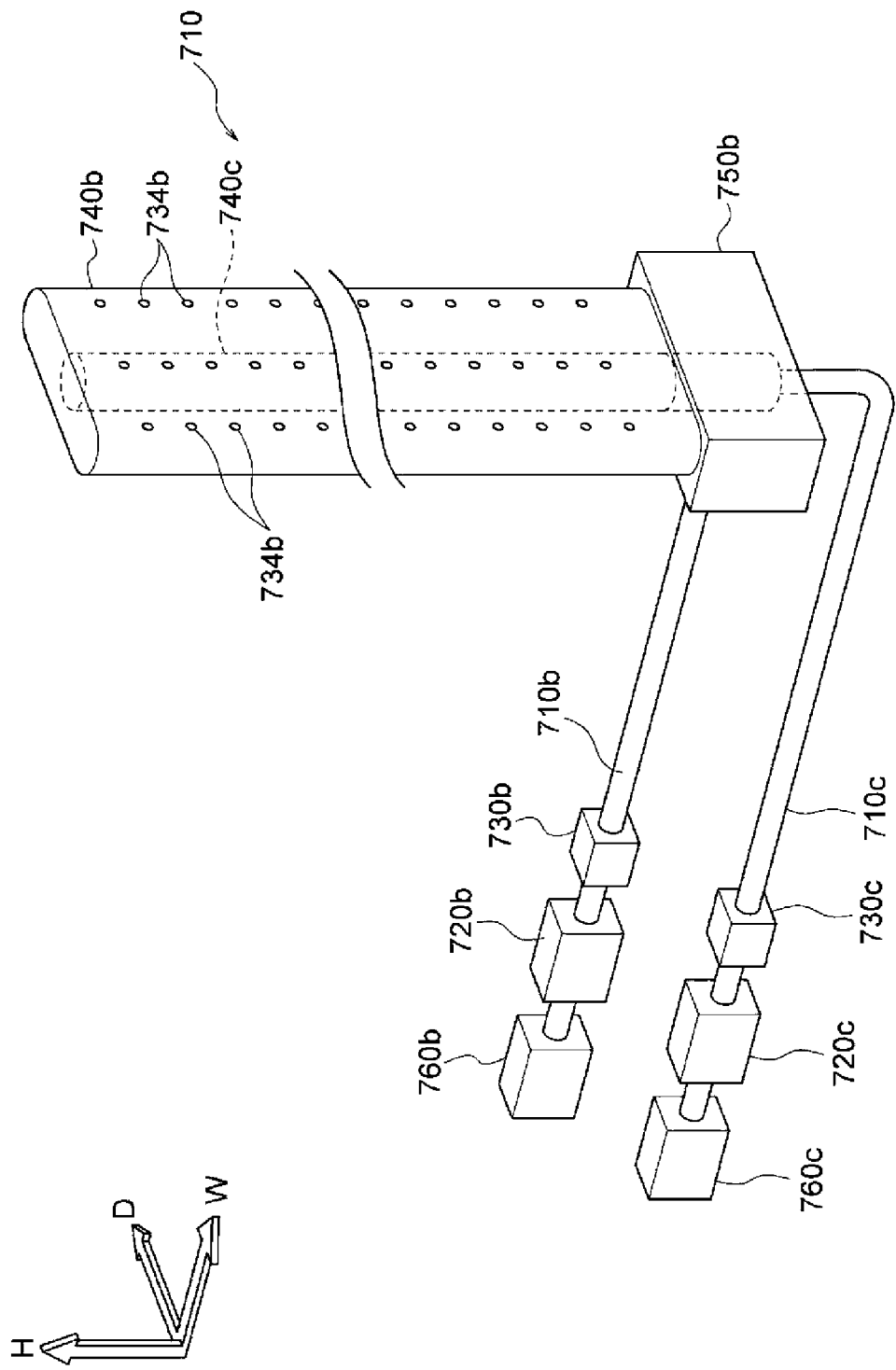
FIG. 13 is a perspective view schematically illustrating components such as a gas nozzle provided in the substrate processing apparatus according to the third modified example.

As shown in FIGS. 12A, 12B and 13, two vertically extending gas nozzles 740b and 740c are disposed in the second nozzle chamber 222b of the substrate processing apparatus 710.

Specifically, the gas nozzle 740b and the gas nozzle 740c are configured as a double-tube nozzle, and the gas nozzle 740c is accommodated in the gas nozzle 740b.

A cross-section perpendicular to the longitudinal direction of the gas nozzle 740b is elliptical and extends in the circumferential direction of the process chamber 201, and a cross-section perpendicular to the longitudinal direction of the gas nozzle 740c is circular.

As shown in FIG. 12A, a plurality of pinhole-shaped ejection holes 734b is provided at both sides of the gas nozzle 740b along the circumferential direction of the process chamber 201. Specifically, the plurality of the ejection holes 734b is provided in a direction inclined with respect to a surface of a wall of the gas nozzle 740b when viewed from above. The plurality of the ejection holes 734b is arranged in the vertical direction at the same intervals. In addition, a range in which the plurality of the ejection holes 734b is arranged in the vertical direction covers the range in which the plurality of the wafers including the wafer 200 is arranged in the vertical direction. In addition, the plurality of the ejection holes 734b is provided so as to face the plurality of the supply slits 235b, respectively.

The gas nozzle 740c is disposed with a gap from an inner circumferential surface of the gas nozzle 740b, and a plurality of pinhole-shaped ejection holes 734c is provided at the gas nozzle 740c. The plurality of the ejection holes 734c is arranged in the vertical direction at the same intervals. In addition, a range in which the plurality of the ejection holes 734c is arranged in the vertical direction covers the range in which the plurality of the wafers including the wafer 200 is arranged in the vertical direction.

A plurality of pinhole-shaped ejection holes 734d are provided in the surface of the wall of the gas nozzle 740b at locations opposite to the plurality of the pinhole-shaped ejection holes 734b. The plurality of the ejection holes 734c and the plurality of the ejection holes 734d are provided so as to face the plurality of the supply slits 235b. In addition, a plurality of communication pipes 742 is provided for communicating the plurality of the ejection holes 734c with the plurality of the ejection holes 734d.

As shown in FIG. 13, a gas supply pipe 710b is connected to a support 750b configured to support the gas nozzles 740b and 740c. The gas supply pipe 710b communicates with a space provided between the inner circumferential surface of the gas nozzle 740b and an outer circumferential surface of the gas nozzle 740c. An inert gas supply source 760b for supplying the inert gas (nitrogen gas), a mass flow controller (MFC) 720b and a valve 720b serving as an opening/closing valve are sequentially provided at the gas supply pipe 710b from the upstream side toward the downstream side in the gas flow direction.

A gas supply pipe 710c is connected to the support 750b. The gas supply pipe 710c communicates with the inside of the gas nozzle 740c. A source gas supply source 760c for supplying the second source gas (silicon source gas), a mass flow controller (MFC) 720c and a valve 730c serving as an opening/closing valve are sequentially provided at the gas supply pipe 710c from the upstream side toward the downstream side in the gas flow direction.

According to the configuration described above, the plurality of the ejection holes 734b of the gas nozzle 740b is inclined with respect to the surface of the wall of the gas nozzle 740b when viewed from above. Therefore, by reducing the turbulence of the inert gas serving as the assist gas ejected through the plurality of the ejection holes 734b, it is possible to suppress the mixing of the assist gas and the second source gas.

By suppressing the mixing of the assist gas and the second source gas, the source gas can effectively reach the centers of the plurality of the wafers including the wafer 200. Therefore, it is possible to suppress the deviation in the thickness of the film formed on the surfaces of the plurality of the wafers including the wafer 200.

Fourth Modified Example

Hereinafter, an example of a substrate processing apparatus 810 according to a fourth modified example of the embodiments will be described with reference to FIG. 14. The differences between the substrate processing apparatus 810 according to the second modified example and the substrate processing apparatus 10 according to the original embodiments will be mainly described. Components of the substrate processing apparatus 810 that are the same as the components of the substrate processing apparatus 10 according to the original embodiments will be denoted by the same reference numerals, and detailed description thereof will be omitted.

Figure 14:
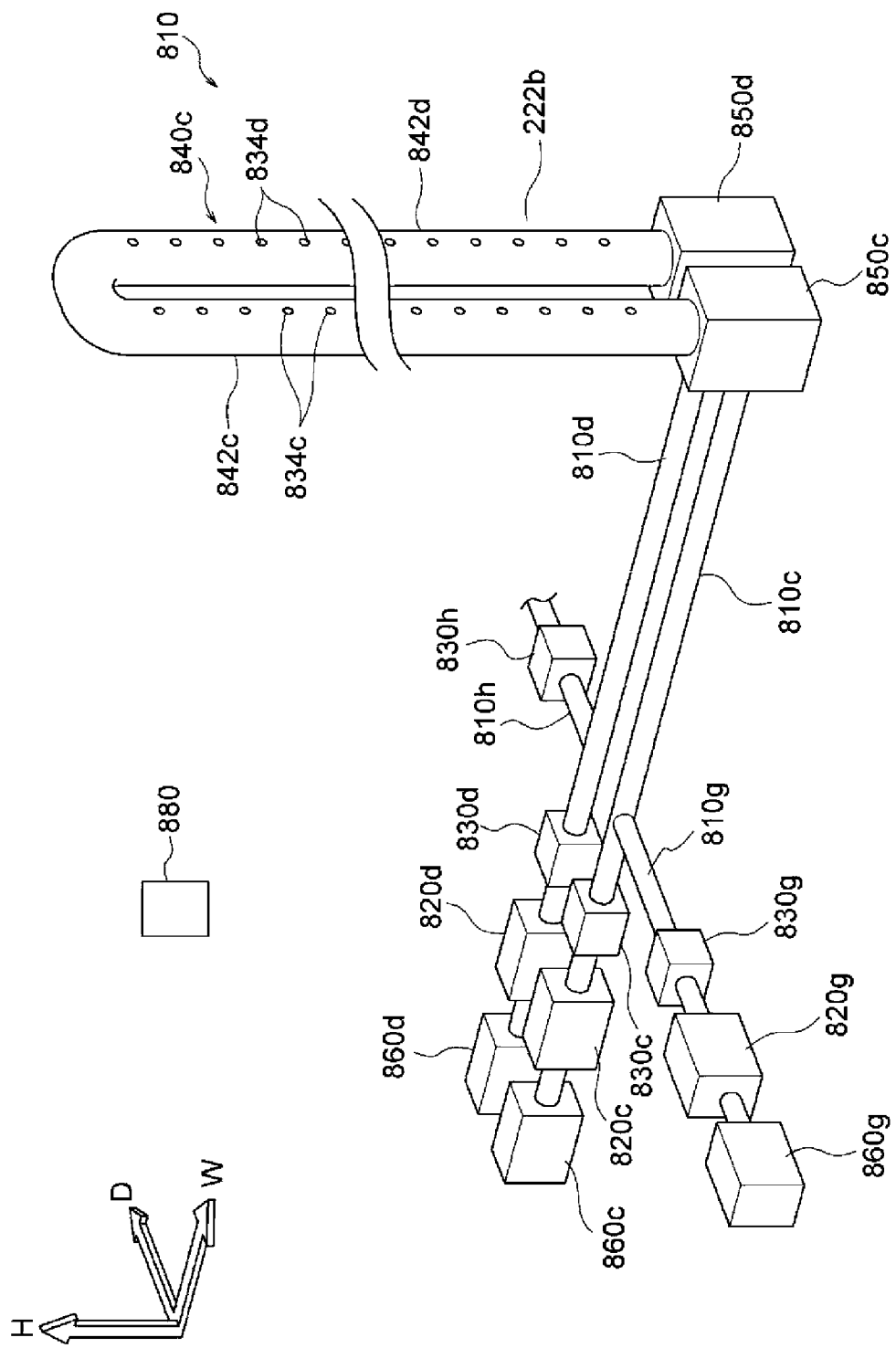
FIG. 14 is a perspective view schematically illustrating components such as a gas nozzle provided in a substrate processing apparatus according to a fourth modified example of the embodiments.

As shown in FIG. 14, a U-shaped gas nozzle 840c folded at an upper end thereof is provided in the second nozzle chamber 222b of the substrate processing apparatus 810.

A plurality of pinhole-shaped ejection holes 834c and a plurality of pinhole-shaped ejection holes 834d are provided at the gas nozzle 840c. Specifically, the gas nozzle 840c includes a pair of extended portions 842c and 842d extending in the vertical direction. At the extended portion 842c, the plurality of the pinhole-shaped ejection holes 834c is arranged in the vertical direction at the same intervals. A range in which the plurality of the ejection holes 834c is arranged in the vertical direction covers the range in which the plurality of the wafers including the wafer 200 is arranged in the vertical direction. In addition, the plurality of the ejection holes 834c is provided so as to face the plurality of the supply slits 235b shown in FIGS. 1 and 6, respectively.

At the extended portion 842d, the plurality of the pinhole-shaped ejection holes 834d is arranged in the vertical direction at the same intervals. A range in which the plurality of the ejection holes 834d is arranged in the vertical direction covers the range in which the plurality of the wafers including the wafer 200 is arranged in the vertical direction. In addition, the plurality of the ejection holes 834d is provided so as to face the plurality of the supply slits 235b shown in FIGS. 1 and 6, respectively.

A gas supply pipe 810c is connected to a nozzle support 850c configured to support the extended portion 842c. A source gas supply source 860c for supplying the second source gas (silicon source gas), a mass flow controller (MFC) 820c and a valve 830c serving as an opening/closing valve are sequentially provided at the gas supply pipe 810c from the upstream side toward the downstream side in the gas flow direction. A gas supply pipe 810g configured to supply the inert gas is connected to the gas supply pipe 810c at a downstream side of the valve 830c. An inert gas supply source 860g for supplying the inert gas (nitrogen gas), a mass flow controller (MFC) 820g and a valve 830g are sequentially provided at the gas supply pipe 810g from the upstream side toward the downstream side in the gas flow direction.

A gas supply pipe 810d is connected to a nozzle support 850d configured to support the extended portion 842d. A source gas supply source 860d for supplying the second source gas (silicon source gas), a mass flow controller (MFC) 820d and a valve 830d serving as an opening/closing valve are sequentially provided at the gas supply pipe 810d from the upstream side toward the downstream side in the gas flow direction. A gas discharge pipe 810h configured to exhaust the process gases is connected to the gas supply pipe 810d at a downstream side of the valve 830d. A valve 830h is provided at the gas discharge pipe 810h. Then, the gas exhaust pipe 810h provided with the valve 830h is connected to the vacuum pump 246.

According to the configuration described above, the valves 830c, 830d, 830g and 830h are opened by the control of a controller 880 of the substrate processing apparatus 810. The silicon (Si) source gas serving as the second source gas and the inert gas (nitrogen gas) serving as the backflow prevention gas are ejected through the plurality of the ejection holes 834c and the plurality of the ejection holes 834d of the gas nozzle 840c, by the control of the controller 880. Alternatively, the inside of the gas nozzle 840c may be purged with the inert gas. When the inside of the gas nozzle 840c is purged with the inert gas, the characteristics of the gas discharge pipe 810h such as the conductance may be set such that the gas in the gas nozzle 840c partially leaks through the plurality of the ejection holes 834c and the plurality of the ejection holes 834d and the remainder of the gas is exhausted without passing through the process chamber 201. The configuration of the fourth modified example is substantially the same as the original embodiments and the modified examples described above in that the gas supply pipes whose flow rates can be independently controlled are provided in one nozzle chamber.

OTHER EMBODIMENTS

While the technique is described in detail by way of the embodiments and the modified examples thereof described above, the above-described technique is not limited thereto. It is apparent to the person skilled in the art that the above-described technique may be modified in various ways without departing from the gist thereof. For example, in the original embodiments and the modified examples thereof described above, the second nozzle chamber 222b communicates with the process chamber 201 by being provided with the plurality of the supply slits 235b on the circumferential wall of the inner tube 12. However, the above-described technique is not limited thereto. For example, according to a fifth modified example shown in FIG. 15, the second nozzle chamber 222b may be communicated with the process chamber 201 by providing a large opening 238 formed by connecting all the slits in the vertical direction on the circumferential wall of the inner tube 12.

Besides, a halosilane-based gas, for example, a chlorosilane-based gas containing silicon and chlorine may be used as the source gas. The chlorosilane-based gas also serves as a silicon source. For example, hexachlorodisilane ($Si_2Cl_6$, abbreviated as HCDS) gas may be used as the chlorosilane-based gas. It will be appreciated that various kinds of gases can also be used to form a thin film including or not including silicon such as high-k films.

The source gas is not limited to a gas containing an element constituting the film. For example, the source gas may contain a catalyst or a reactant (also referred to as an "active species" or a "reducing agent") which reacts with other source gases without providing the element constituting the film. For example, an atomic hydrogen may used as the first source gas to form a silicon film. For example, disilane ($Si_2H_6$) gas may be used as the first source gas and tungsten hexafluoride ($WF_6$) gas may be used as the second source gas (reactive gas) to form a tungsten (W) film. In addition, the reactive gas may be any gas that reacts with other source gases no matter whether the element constituting the film is provided.

According to some embodiments in the present disclosure, it is possible to suppress the deviation in the thickness of the film formed on the substrate.

What is claimed is:
1. A substrate processing apparatus comprising:
a substrate retainer configured to support a substrate;
a tubular part having a process chamber configured to accommodate the substrate retainer, the tubular part comprising:
a discharge part configured to discharge a fluid in the process chamber to an outside thereof; and
a supply part configured to supply a process gas capable of processing the substrate into the process chamber and disposed at a position different from the discharge part;
a nozzle chamber configured to communicate with the process chamber through the supply part;
a plurality of nozzles arranged in the nozzle chamber in a circumferential direction and comprising:
a first nozzle extending in an axial direction and provided with, on a side surface thereof, a plurality of first ejection holes configured to eject the process gas flowing in the first nozzle into the process chamber through a plurality of first supply holes;
a second nozzle extending in the axial direction and provided with, on a side surface thereof, a plurality of second ejection holes configured to eject the process gas flowing in the second nozzle into the process chamber through a plurality of second supply holes; and
a third nozzle extending in the axial direction and provided with, on a side surface thereof, a plurality of third ejection holes configured to eject the process gas flowing in the third nozzle into the process chamber through a plurality of third supply holes; and
a plurality of gas supply pipes through which the plurality of the nozzles communicate with a plurality of gas supply sources, respectively, wherein
the process gas comprises a first gas, a second gas and a third gas, wherein at least one of the first gas and the second gas comprises an element constituting a film formed on the substrate,
the first nozzle comprises two gas nozzles, one of which is configured to eject the first gas and the other of which is configured to eject the third gas,
the second nozzle is provided in an axial direction of the tubular part and between the two gas nozzles of the first nozzle such that the third gas is supplied while the first gas is being ejected through the first nozzle and the second gas is supplied while the first gas is not being ejected through the first nozzle, the third nozzle comprises two gas nozzles provided adjacent to each of the two gas nozzles of the first nozzle, respectively, and configured to eject the third gas, and a supply amount or a flow rate of the third gas ejected through the plurality of the first ejection holes or the plurality of the third ejection holes is less than a supply amount and a flow rate of the second gas ejected through the plurality of the second ejection holes, while the second nozzle ejects the second gas.

2. The substrate processing apparatus of claim 1, wherein the second nozzle is interposed between the two gas nozzles of the third nozzle in the circumferential direction, and one of the two gas nozzles of the third nozzle is disposed opposite to the second nozzle in a manner that one of the two gas nozzles of the first nozzle is interposed therebetween, and the other of the two gas nozzles of the third nozzle is disposed opposite to the second nozzle in a manner that the other of the two gas nozzles of the first nozzle is interposed therebetween.

3. The substrate processing apparatus of claim 1, wherein the nozzle chamber comprises a first nozzle chamber, a second nozzle chamber and a third nozzle chamber, consecutively disposed in the circumferential direction at an outer circumference side of the tubular part, the second nozzle is disposed in the second nozzle chamber, the first nozzle is disposed in each of the first nozzle chamber and the third nozzle chamber, and the third nozzle is disposed either at both sides of the second nozzle in the second nozzle chamber or in each of the first nozzle chamber and the third nozzle chamber.

4. The substrate processing apparatus of claim 1, wherein an ejection time period during which the third gas is ejected through either the first nozzle or the third nozzle at least partly overlaps with an ejection time period during which the second gas is ejected through the second nozzle, and the first ejection holes of the first nozzle, the second ejection holes of the second nozzle and the third ejection holes of the third nozzle are open toward a center of the substrate or parallel to one another.

5. The substrate processing apparatus of claim 1, wherein the first nozzle is further configured to intermittently eject the third gas, in a state where neither of the first gas and the second gas is being supplied into the process chamber.

6. The substrate processing apparatus of claim 1, wherein a region where the first ejection holes of the first nozzle and the second ejection holes of the second nozzle are formed covers a substrate arrangement region wherein a plurality of substrates including the substrate are disposed, and the third nozzle is provided with the third ejection holes disposed at least one of an upper portion and a lower portion of the substrate arrangement region without any third ejection hole being disposed at a center portion between the upper portion and the lower portion of the substrate arrangement region.

7. The substrate processing apparatus of claim 1, wherein the first nozzle is provided with the plurality of the first ejection holes corresponding to a plurality of substrates including the substrate, the second nozzle is provided with the plurality of the second ejection holes corresponding to the plurality of the substrates, the plurality of the first supply holes, the plurality of the second supply holes, and the plurality of the third supply holes are horizontal slits extending in a horizontal direction, and each of the slits corresponds to the plurality of the substrates, respectively.

8. The substrate processing apparatus of claim 1, wherein the second nozzle has a U-shape folded at an upper end thereof, a second gas supply source and a third gas supply source are fluidly connected to one or more of the plurality of the gas supply pipes communicating with one end of the second nozzle, and a gas discharge pipe is connected to other end of the second nozzle such that an inside of the second nozzle is purged with an inert gas.

9. The substrate processing apparatus of claim 1, wherein the third nozzle comprises the plurality of the third ejection holes disposed in two rows, and the second nozzle comprises a plurality of communication holes installed inside of the third nozzle and configured to communicate with an outside of the third nozzle between two rows of the first nozzle such that the second nozzle and the third nozzle simultaneously eject the second gas and the third gas, respectively.

10. A method of manufacturing a semiconductor device comprising:

providing the substrate processing apparatus of claim 1, and processing a substrate by performing:

(a) ejecting the second gas into the process chamber through the second nozzle while ejecting the third gas into the process chamber through the first or the third nozzle; and (b) ejecting the first gas into the process chamber through the first nozzle.

11. A substrate processing apparatus comprising:

a substrate retainer configured to support a substrate;

a tubular part having a process chamber configured to accommodate the substrate retainer, the tubular part comprising:

a discharge part configured to discharge a fluid in the process chamber to an outside thereof; and a supply part configured to supply a process gas capable of processing the substrate into the process chamber and disposed at a position different from the discharge part;

a nozzle chamber configured to communicate with the process chamber though the supply part and accommodate a plurality of nozzles;

the plurality of nozzles arranged in the nozzle chamber in a circumferential direction and comprising:

a first nozzle extending in an axial direction and provided with, on a side surface thereof, a plurality of first ejection holes configured to eject the process gas flowing in the first nozzle into the process chamber through a plurality of first supply holes;

a second nozzle extending in the axial direction and provided with, on a side surface thereof, a plurality of second ejection holes configured to eject the process gas flowing in the second nozzle into the process chamber through a plurality of second supply holes; and a third nozzle extending in the axial direction and provided with, on a side surface thereof, a plurality of third ejection holes configured to eject the process gas flowing in the third nozzle into the process chamber through a plurality of third supply holes; and a plurality of gas supply pipes through which the plurality of the nozzles communicate with a plurality of gas supply sources, respectively, wherein the process gas comprises a first gas, a second gas and a third gas, wherein at least one of the first gas and the second gas comprises an element constituting a film formed on the substrate, the first nozzle comprises two gas nozzles, one of which is configured to eject the first gas and the other of which is configured to eject the third gas, the second nozzle is provided in the axial direction of the tubular part and between the two gas nozzles of the first nozzle, the second nozzle configured to eject the second gas, and the third nozzle comprises two gas nozzles provided adjacent to each of the two gas nozzles of the first nozzle, respectively, and configured to eject the third gas through the plurality of the third ejection holes disposed at least one of an upper portion and a lower portion of a substrate arrangement region such that surpluses of the first gas or the second gas is diluted or purged.

12. The substrate processing apparatus of claim 11, wherein the third nozzle is further configured to dilute or purge the third gas, in a state where the first nozzle is ejecting the first gas or the second nozzle is ejecting the second gas.

13. The substrate processing apparatus of claim 11, wherein the plurality of the second ejection holes of the second nozzle extend to cover the substrate arrangement region.

14. The substrate processing apparatus of claim 11, wherein the second nozzle extends upward and bends in a radial direction of the tubular part, and the plurality of the second ejection holes of the second nozzle are more closely disposed to a center of the process chamber compared to the plurality of the first ejection holes of the first nozzle to the center of the process chamber.

15. A method of manufacturing a semiconductor device comprising:
providing the substrate processing apparatus of claim 11, and
processing a substrate by performing:
(a) ejecting the second gas into the process chamber through the second nozzle while ejecting the third gas into the process chamber through the first or the third nozzle; and
(b) ejecting the first gas into the process chamber through the first nozzle.

16. A substrate processing apparatus comprising:
a substrate retainer configured to support a substrate;
a tubular part having a process chamber configured to accommodate the substrate retainer, the tubular part comprising:
a discharge part configured to discharge a fluid in the process chamber to an outside thereof; and
a supply part configured to supply a process gas capable of processing the substrate into the process chamber and disposed at a position different from the discharge part;
a nozzle chamber configured to communicate with the process chamber through the supply part;
a plurality of nozzles arranged in the nozzle chamber in a circumferential direction and comprising:
a first nozzle extending in an axial direction and provided with, on a side surface thereof, a plurality of first ejection holes configured to eject the process gas flowing in the first nozzle into the process chamber through a plurality of first supply holes;
a second nozzle extending in the axial direction and provided with, on a side surface thereof, a plurality of second ejection holes configured to eject the process gas flowing in the second nozzle into the process chamber through a plurality of second supply holes; and
a third nozzle extending in the axial direction and provided with, on a side surface thereof, a plurality of third ejection holes configured to eject the process gas flowing in the third nozzle into the process chamber through a plurality of third supply holes;
a plurality of gas supply pipes through which the plurality of the nozzles communicate with a plurality of gas supply sources, respectively; and
a controller;
wherein the process gas comprises a first gas, a second gas, and a third gas, wherein at least one of the first gas and the second gas comprises an element constituting a film formed on the substrate,
the first nozzle comprises two gas nozzles, each of which is configured to eject the third gas,
the second nozzle is provided in the axial direction of the tubular part and between the two gas nozzles of the first nozzle, the second nozzle configured to eject the second gas,
the third nozzle is provided adjacent to one of the two gas nozzles of the first nozzle, and is configured to eject the third gas, and
the controller is configured to control a flow rate or a flow velocity of the second gas ejected from the plurality of the second ejection holes of the second nozzle and a flow rate or a flow velocity of the third gas ejected from at least either one of the plurality of the first ejection holes of the first nozzle and the plurality of the third ejection holes of the third nozzle, such that the second gas ejected out of the nozzle chamber through the second supply holes is prevented from flowing back into the nozzle chamber.

17. The substrate processing apparatus of claim 16, wherein the controller is further configured to: control the flow rate or the flow velocity of the third gas exhausted both through the plurality of the first ejection holes and the plurality of the third ejection holes while the second gas is being ejected through the second nozzle; and control a thickness of the film formed on the substrate to have either a convex distribution or a concave distribution.

18. The substrate processing apparatus of claim 16, wherein the third nozzle comprises two gas nozzles provided adjacent to each of the two gas nozzles of the first nozzle, respectively.

19. The substrate processing apparatus of claim 16, wherein one of the gas supply pipes communicating with the first nozzle or the third nozzle is provided with a first flow rate controller configured to control the flow rate of the third gas, another one of the gas supply pipes communicating with the second nozzle is provided with a second flow rate controller configured to control the flow rate of the second gas, the first flow rate controller and second flow rate controller perform controls such that the flow rate or the flow velocity of the third gas ejected both through the first ejection holes for each of the two gas nozzles of the first nozzle or the third ejection holes of the third nozzle is greater than the flow rate or the flow velocity of the second gas ejected through the second ejection holes of the second nozzle, in a state where an opening degree of the second nozzle is greater than that of the first nozzle.

20. The substrate processing apparatus of claim 16, wherein the second nozzle is provided with the second ejection holes disposed along a substrate arrangement region where the substrate is arranged in the process chamber, and
the third nozzle is provided with the third ejection holes disposed at least one of an upper portion and a lower portion of the substrate arrangement region without any third ejection hole being disposed at a center portion between the upper portion and the lower portion of the substrate arrangement region.

21. The substrate processing apparatus of claim 16, wherein the controller is configured to be capable of controlling the flow rate of the third gas ejected through the first ejection holes for each of the two gas nozzles of the first nozzle is less than the flow rate of the second gas ejected through the second ejection holes of the second nozzle or the flow rate of the second gas is set to a predetermined value so as to decrease a temperature of the second gas to a temperature at which a decomposition of the second gas is suppressed.

22. A method of manufacturing a semiconductor device comprising:
providing the substrate processing apparatus of claim 16, and
processing a substrate by performing:
(a) ejecting the second gas into the process chamber through the second nozzle while ejecting the third gas into the process chamber through the first or the third nozzle; and
(b) ejecting the first gas into the process chamber through the first nozzle.

\* \* \* \* \*